(12) United States Patent
Daub et al.

(10) Patent No.: US 8,326,565 B2
(45) Date of Patent: Dec. 4, 2012

(54) CHIP TESTER, METHOD FOR PROVIDING TIMING INFORMATION, TEST FIXTURE SET, APPARATUS FOR POST-PROCESSING PROPAGATION DELAY INFORMATION, METHOD FOR POST-PROCESSING DELAY INFORMATION, CHIP TEST SET UP AND METHOD FOR TESTING DEVICES UNDER TEST

(75) Inventors: Michael Daub, Herrenberg (DE); Alf Clement, Gartringen (DE); Bernd Laquai, Stuttgart (DE)

(73) Assignee: Advantest (Singapore) Pte Ltd, Singapore (SG)

( * ) Notice: Subject to any disclaimer, the term of this patent is extended or adjusted under 35 U.S.C. 154(b) by 279 days.

(21) Appl. No.: 12/674,644

(22) PCT Filed: Aug. 22, 2007

(86) PCT No.: PCT/EP2007/007388
§ 371 (c)(1),
(2), (4) Date: Jul. 30, 2010

(87) PCT Pub. No.: WO2009/024173
PCT Pub. Date: Feb. 26, 2009

(65) Prior Publication Data
US 2011/0131000 A1   Jun. 2, 2011

(51) Int. Cl.
*G06F 19/00* (2011.01)
*G01R 31/28* (2006.01)

(52) U.S. Cl. .................................. 702/118; 714/724
(58) Field of Classification Search .................. 702/118, 702/121; 714/724, 742; 324/750.15, 762.01
See application file for complete search history.

(56) References Cited

U.S. PATENT DOCUMENTS
| 7,088,122 B2 * | 8/2006 | Hartmann et al. ....... 324/762.03 |
| 2007/0022350 A1 | 1/2007 | McAuliffe |

FOREIGN PATENT DOCUMENTS
| KR | 100736676 B1 | 2/2007 |
| WO | WO 97/37235 A1 | 10/1997 |

* cited by examiner

*Primary Examiner* — Bryan Bui
(74) *Attorney, Agent, or Firm* — Holland & Hart LLP

(57) ABSTRACT

A chip tester for testing at least two devices under test connected to the chip tester has a timing calculator for generating a timing information for the channels of the chip tester. The timing calculator is adapted to obtain a propagation delay difference information describing a difference between, on the one hand, a propagation delay from the first channel port of the chip tester to the first terminal of the first device under test and, on the other hand, a propagation delay from the first channel port of the chip tester to the second terminal of the second device under test. The timing calculator is adapted to provide a timing information for a second channel of the chip tester connected to the first device under test or to the second device under test on the basis of the propagation delay difference information. The channel module configurator is adapted to configure the second channel of the chip tester on the basis of the timing information.

28 Claims, 17 Drawing Sheets

Signal at (134)

Signal at (136)

Signal at (138)

$\Delta t12 = \text{average} (\Delta tp1,2 - \Delta tp1,1; \Delta tp2,2 - \Delta tp2,1; ...)$

CHIP TESTER, METHOD FOR PROVIDING TIMING INFORMATION, TEST FIXTURE SET, APPARATUS FOR POST-PROCESSING PROPAGATION DELAY INFORMATION, METHOD FOR POST-PROCESSING DELAY INFORMATION, CHIP TEST SET UP AND METHOD FOR TESTING DEVICES UNDER TEST

BACKGROUND OF THE INVENTION

The present invention is generally related to a chip tester, a method for providing timing information, a test fixture set, an apparatus for post-processing propagation delay information, a method for post-processing delay information, a chip test set up and a method for testing devices under test.

In an embodiment, the present invention is related to a fixture delay calibration in a driver sharing test environment.

In the field of testing devices it is sometimes advantageous to connect a plurality of devices under test to a common line. Consequently, terminals of at least two devices under test are connected to a common channel of a chip tester. These terminals are typically designated as shared terminals. However, some of the terminals of the devices under test are connected to channels of the chip tester via individual (non-shared or unshared) lines. Thus, in typical setups there are both shared terminals of devices under test, which are connected to the chip tester via a shared line and unshared terminals, which are connected to channels of the chip tester via unshared lines.

However, the sharing of lines for connecting a plurality of devices under test to a single channel brings along significant difficulties in obtaining reliable test results.

SUMMARY

According to an embodiment, a chip tester for testing at least two devices under test connected to the chip tester, wherein at least a first terminal of the a first device under test and a first terminal of a second device under test are connected to a first channel of the chip tester via a shared line, wherein a second terminal of the first device under test is connected to a second channel of the chip tester via an unshared line, and wherein a second terminal of the second device under test is connected to a third channel of the chip tester via an unshared line, may have a timing calculator for generating a timing information for the channels of the chip tester, wherein the timing calculator is adapted to acquire a propagation delay difference information describing a difference between, on the one hand, a propagation delay from a first channel port of the chip tester to the first terminal of the first device under test and, on the other hand, a propagation delay from the first channel port of the chip tester to the first terminal of the second device under test, and wherein the timing calculator is adapted to provide timing information to adjust a timing shift between timings of the second channel and the third channel on the basis of the propagation time difference information; and a channel module configurator adapted to configure the second channel and/or the third channel of the chip tester on the basis of the timing information.

According to another embodiment, a test fixture set may have a device under test board for providing an electrical connection between a chip tester and at least two devices under test, wherein device under test board may have a first device under test contact element for providing a detachable electrical contact between the device under test board and a first device under test, a second device under test contact element for providing a detachable electrical contact between the device under test board and a second device under test, a third device under test contact element for providing a detachable electrical contact between the device under test board and the first device under test, a fourth device under test contact element for providing a detachable electrical contact between the device under test board and the second device under test, a first chip tester contact element for providing a detachable electrical contact between the device under test board and the chip tester, a second chip tester contact element for providing a detachable electrical contact between the device under test board and the chip tester, and a third chip tester contact element for providing a detachable electrical contact between the device under test board and the chip tester, wherein the first device under test contact element and the second device under test contact element are both electrically connected to the first chip tester contact element via a shared line; wherein the third device under test contact element is electrically connected to the second chip tester contact element; wherein the fourth device under test contact element is electrically connected to the third chip tester contact element; and a data exchange medium or data stream for usage with the chip tester, the data exchange medium or data stream comprising an effective propagation delay information describing an effective propagation delay between the third device under test contact element and the second chip tester contact element and an effective propagation delay between the fourth device under test contact element and the third chip tester contact element, wherein the effective propagation delays are based on actual propagation delays and wherein at least one of the effective propagation delays is changed with respect to a corresponding actual propagation delay, such that the deviation of the effective propagation delay from the actual propagation delay reflects a difference between, on the one hand, a propagation delay between the first chip tester contact element and the first device under test contact element and, on the other hand, a propagation delay between the first chip tester contact element and the second device under test contact element.

According to another embodiment, an apparatus for post-processing a plurality of propagation delay values of a device under test board for a chip tester, wherein the device under test board is adapted to provide an electrical connection between a chip tester and at least two devices under test, and wherein the device under test board has a first device under test contact element for providing a detachable electrical contact between the device under test board and a first device under test, a second device under test contact element for providing a detachable electrical contact between the device under test board and a second device under test, a third device under test contact element for providing a detachable electrical contact between the device under test board and the first device under test, a fourth device under test contact element for providing a detachable electrical contact between the device under test board and the second device under test, a first chip tester contact element for providing a detachable contact between the device under test board and the chip tester, a second chip tester contact element for providing a detachable contact between the device under test board and the chip tester, a third chip tester contact element for providing a detachable electrical contact between the device under test board and a chip tester, wherein the first device under test contact element and the second device under test contact element are both electrically connected to the first chip tester contact element via a shared line, wherein the apparatus may have a propagation delay determinator for acquiring an original propagation delay value describing a propagation delay between the fourth device under test contact element and the third chip tester contact element; a propagation delay difference value determinator for acquiring a propagation delay difference value describing a difference between, on the one hand, a propagation delay between the first chip tester contact element and the first device under test contact element and, on the other hand, a propagation delay between the first chip tester contact element and the second device under test contact element; and a propagation delay modifier for modifying the original propagation delay value on the basis of the propagation delay difference value.

According to another embodiment, a method for providing timing information for adjusting a timing of a chip tester operating in a configuration in which at least a first terminal of a first device under test and a first terminal of a second device under test are connected to a first channel of the chip tester via a shared line and in which a second terminal of the first device under test is connected to a second channel of the chip tester via an unshared line and in which a second terminal of the second device under test is connected to a third channel of the chip tester via an unshared line, may have the steps of acquiring a propagation delay difference information describing a propagation time difference between, on the one hand, the propagation delay from a first channel port of the chip tester to the first terminal of the first device under test, and, on the other hand, a propagation delay from the first channel port of the chip tester to the first terminal of the second device under test; and providing the timing information to adjust a timing shift between timings of the second channel and the third channel on the basis of the propagation time difference information.

According to another embodiment, a method for post-processing a plurality of propagation delay values for a device under test board for a chip tester, wherein the device under test board is adapted to provide an electrical connection between the chip tester and at least two devices under test, and wherein the device under test board has a first device under test contact element for providing a detachable electrical contact between the device under test board and a first device under test, a second device under test contact element for providing a detachable electrical contact between the device under test board and a second device under test, a third device under test contact element for providing a detachable electrical contact between the device under test board and the first device under test, a fourth device under test contact element for providing a detachable electrical contact between the device under test board and the second device under test, a first chip tester contact element for providing a detachable electrical contact between the device under test board and the chip tester, a second chip tester contact element for providing a detachable electrical contact between the device under test board and the chip tester, and a third chip tester contact element for providing a detachable electrical contact between the device under test board and a chip tester, wherein the first device under test contact element and the second device under test contact element are both electrically connected to the first chip tester contact element via a shared line, may have the steps of acquiring an original propagation delay value describing a propagation delay between the fourth device under test contact element and the third chip tester contact element; acquiring a propagation delay difference value describing a difference between, on the one hand, a propagation delay between the first chip tester contact element and the first device under test contact element, and, on the other hand, a propagation delay between the first chip tester contact element and the second chip tester contact element; and modifying the original propagation delay value using the propagation delay difference value.

An embodiment of the present invention creates a chip tester for testing at least two devices under test. The chip tester comprises a first channel and a second channel, a timing calculator for generating a timing information for the channels of the chip tester and a channel module configurator. The timing calculator is adapted to generate a timing information for the channels of the chip tester, and is further adapted to obtain a propagation delay difference information describing a difference between, on the one hand, a propagation delay from a first channel port of the chip tester to a first terminal of the first device under test (DUT) and, on the other hand, a propagation delay from the first channel port of the chip tester to a first terminal of a second device under test. The timing calculator is adapted to provide a timing information for a second channel of the chip tester connected to the first device under test or to the second device under test on the basis of the propagation delay difference information. The channel module configurator is adapted to configure the second channel of the chip tester on the basis of the timing information.

Moreover, the present invention creates means and methods according to the parallel independent claims. Besides, embodiments of the present invention are defined by the dependent claims.

BRIEF DESCRIPTION OF THE DRAWINGS

Embodiments of the present invention will subsequently be described taking reference to enclosed figures, in which.

DETAILED DESCRIPTION OF THE INVENTION

Figure 1:
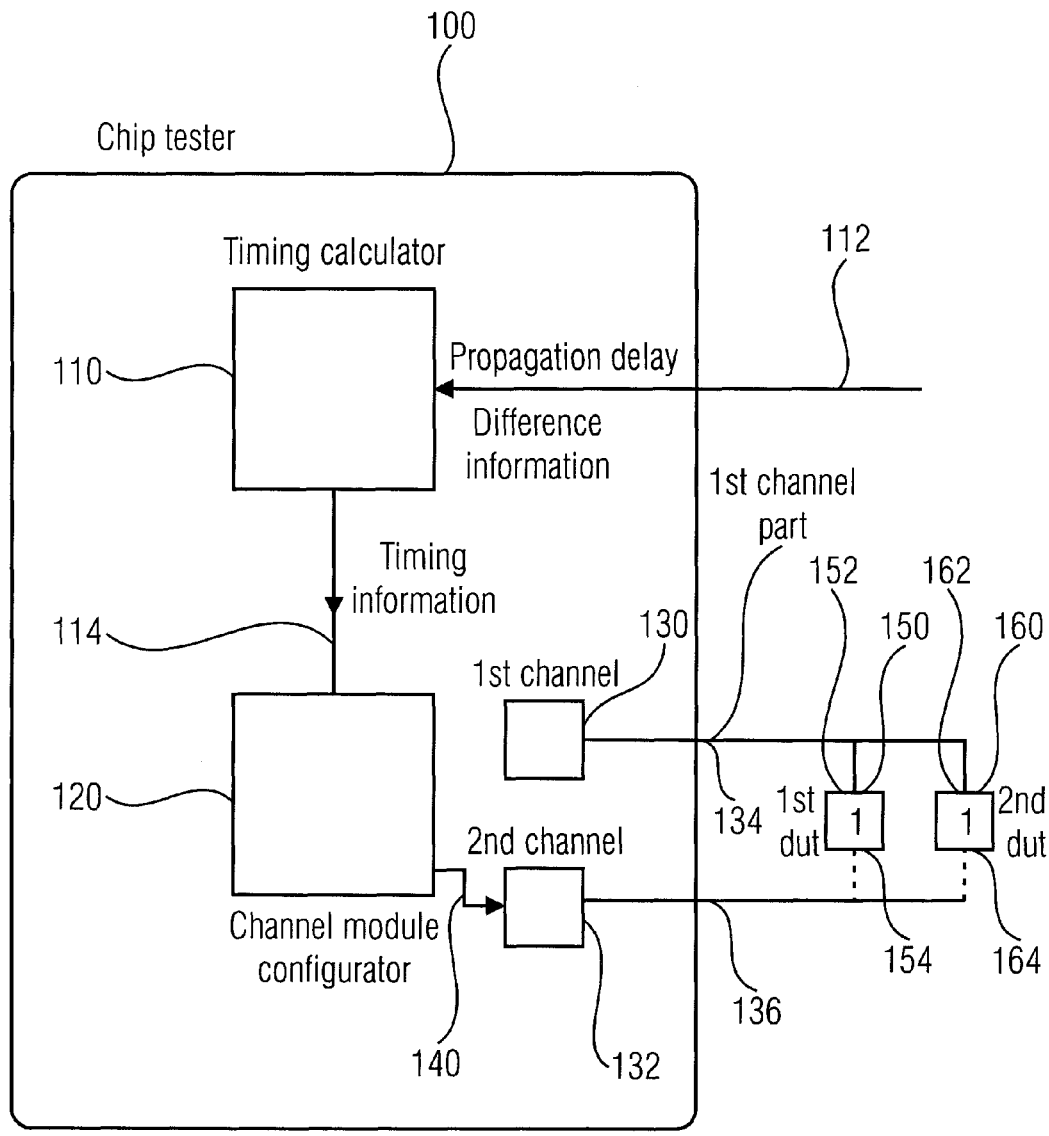
FIG. 1 shows a schematic diagram of a chip tester, according to an embodiment of the present invention.

FIG. 1 shows a block schematic diagram of a chip tester according to an embodiment of the present invention. The chip tester of FIG. 1 is designated in its entirety with 100. The chip tester 100 comprises a timing calculator 110, which is adapted to obtain (e.g. to read or to measure) a propagation delay difference information 112. The timing calculator 110 is further adapted to provide a timing information 114 to a channel module configurator 120. The chip tester 100 further comprises a first channel 130 and a second channel 132, wherein a dut terminal of the first channel 130 is routed to a first channel port 134, and wherein a dut terminal of the second channel 132 is routed to a second channel port 136. Moreover, the second channel 132 is cabled to the channel module configurator 120 to receive timing configuration information 140 from the channel module configurator 120. Optionally the first channel 130 may also be connected to the channel module configurator 120.

It should further be noted that the graphical representation of FIG. 1 shows a first device under test 150 and a second device under test 160, which are connected to the chip tester 100. However, it should be noted that the devices under test 150, 160 are naturally not part of the chip tester. However, a first terminal 152 of the first device under test 150 is connected to the first terminal port 134 of the chip tester 100, and the first terminal 162 of the second device under test 160 is also connected to the first channel port 134 of the chip tester 100. Moreover, a second terminal 164 of the second device under test 160 (which may be an input terminal or an output terminal, or an input/output terminal) is cabled to the second channel port 136 of the chip tester 100. However, alternatively a second terminal 154 of the first device under test 150 (which may be an input terminal or an output terminal, or an input/output terminal) is connected to the second channel port 136.

Based on the above structural description, the functionality of the chip tester 100 will subsequently described. The propagation delay difference information 112 describes the difference between, on the one hand, a propagation delay from the first channel port 134 of the chip tester to the first terminal 152 of the first device under test 150, and, on the other hand, a propagation delay from the first channel port 134 of the chip tester to a first terminal 162 of the second device under test. Thus, the timing calculator of the chip tester handles information about a difference of propagation delays of a signal output at the first channel port 134 traveling to the first device under test 150 and to the second device under test 160. This information is relevant as the propagation times between the first channel port 134 and the terminals 152, 162 of the devices under test 150, 160 may be different, for example, if the devices under test 150, 160 are connected to the first channel port 134 in a bus-like structure (e.g. using a common transmission line having taps with different distances from the first channel port for providing the signals to the terminals 152, 162 of the devices under test 150, 160). The timing calculator 110 is adapted to provide a timing information for the second channel 132 of a chip tester on the basis of the propagation delay difference information 112. The channel module configurator is adapted to configure the second channel 132 of the chip tester 110 on the basis of the timing information 114. Consequently, a timing of the second channel 132 can be adapted in dependence on the propagation delay difference information 112. Thus, an appropriate timing of the signals reaching the devices under test can be achieved, in spite of the different propagation delay times between the first channel port and the terminals 152, 162 of the first device under test 150 and the second device under test 160.

It should be noted here that the second channel 132 can either be an input channel, an output channel (also designated as driver channel) or an input/output channel. Moreover, it should be noted that the second channel 132 can be an input/output channel configured to act either as an input channel only or as an output channel only.

In the following, different configurations of the devices under test will be described, which can be used in specific embodiments of the present invention.

Figure 2A:
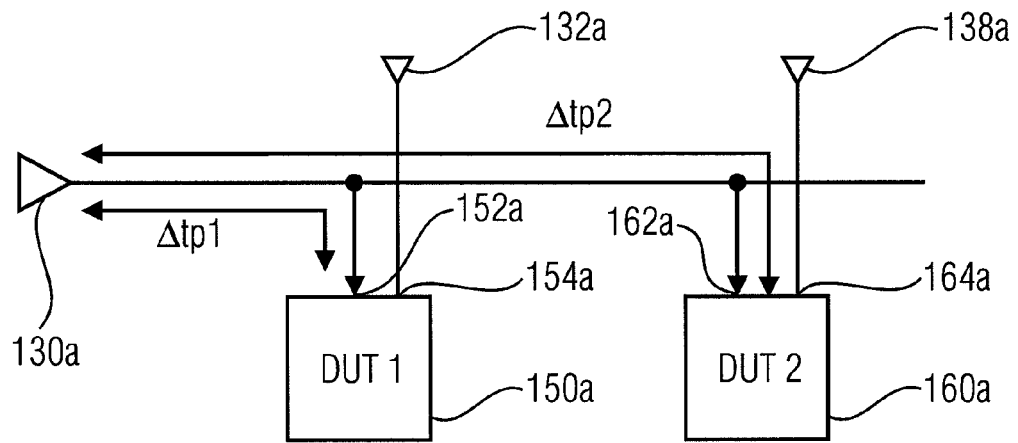
FIGS. 2a to 2c show possible configurations of two devices under test, according to embodiments of the present invention.

FIG. 2a shows a block schematic diagram of a first dut configuration. A first dut 150a comprises a first input terminal 152a and a second input terminal 154a. A second device under test 160a comprises a first input terminal 162a and a second input terminal 164a. It should be noted here that the first input terminal 152a of the first dut 150a and the first input terminal 162a of the second dut 160a are both connected to an output channel (driver channel) 130a of a chip tester. Moreover, the second input port 154a of the first dut 150a is cabled (or electrically connected) to a second output port 132a of a chip tester. The second input port 164a of the second dut 160a is further connected to a third output port 138a of the chip tester. Moreover, a propagation delay between the output channel (driver channel) 130a (or a corresponding channel port) and the input terminal 152a of the first dut 150 is designated with Δtp1. A propagation delay between the output channel (driver channel) 130a (or a corresponding channel port) and the first input terminal 162a of the second dut 160a is designated with Δtp2.

Naturally, the duts 150a, 160a may also comprise outputs, which are not shown here for the sake of simplicity. Signals, which may be present at the dut outputs may, for example, be input into the chip tester, and may further be used in order to decide whether a dut fulfills a desired specification.

It should be noted here that the first output channel (driver channel) 130a, may, in an embodiment, be identical to the first channel 130. Moreover, the second output channel (driver channel) 132a may be identical to the second channel 132.

Figure 2B:
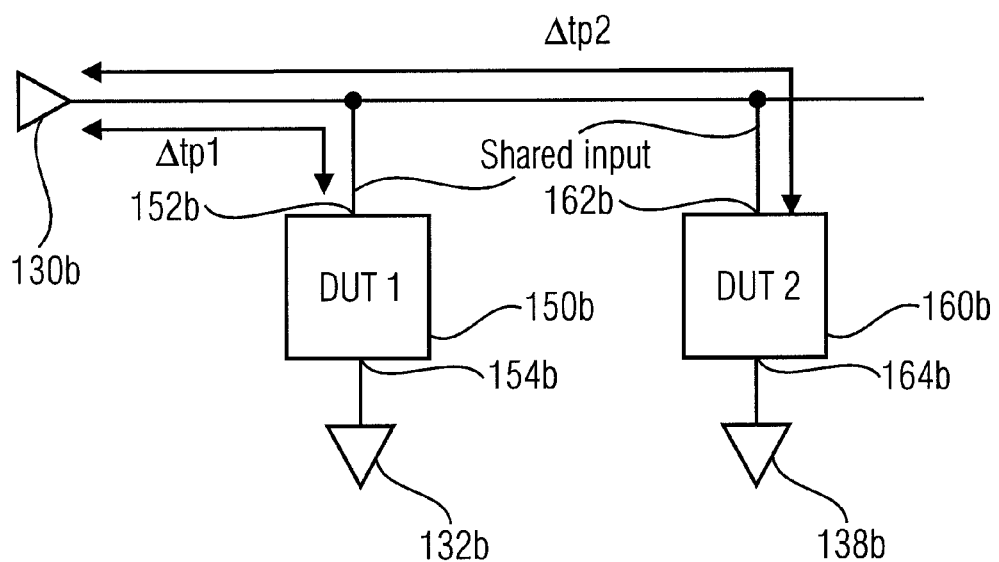

FIG. 2b shows a block schematic diagram of another dut configuration. A first dut 150b comprises an input terminal 152b and an output terminal 154b. A second dut 160b comprises an input terminal 162b and an output terminal 164b. The input terminals 152b, 162b of the first and second dut 150b, 160b are both connected to a an output channel 130b of a chip tester. Propagation delays between the output channel 130b and the input terminals 152b, 162b are again designated with Δtp1 and Δtp2.

Moreover, the output terminal 154b of the first dut 150b is coupled (or electrically connected) with a first input channel 132b (or an input/output channel configured as an input) of the chip tester. Similarly, the output terminal 164b of the second dut 160 is coupled to an input channel (or input/output channel configured as an input) 138b of the chip tester.

It should be noted that the output channel 130b may be identical to the first channel 130 and that the input channel 132b may be identical to the second channel 132.

Figure 2C:
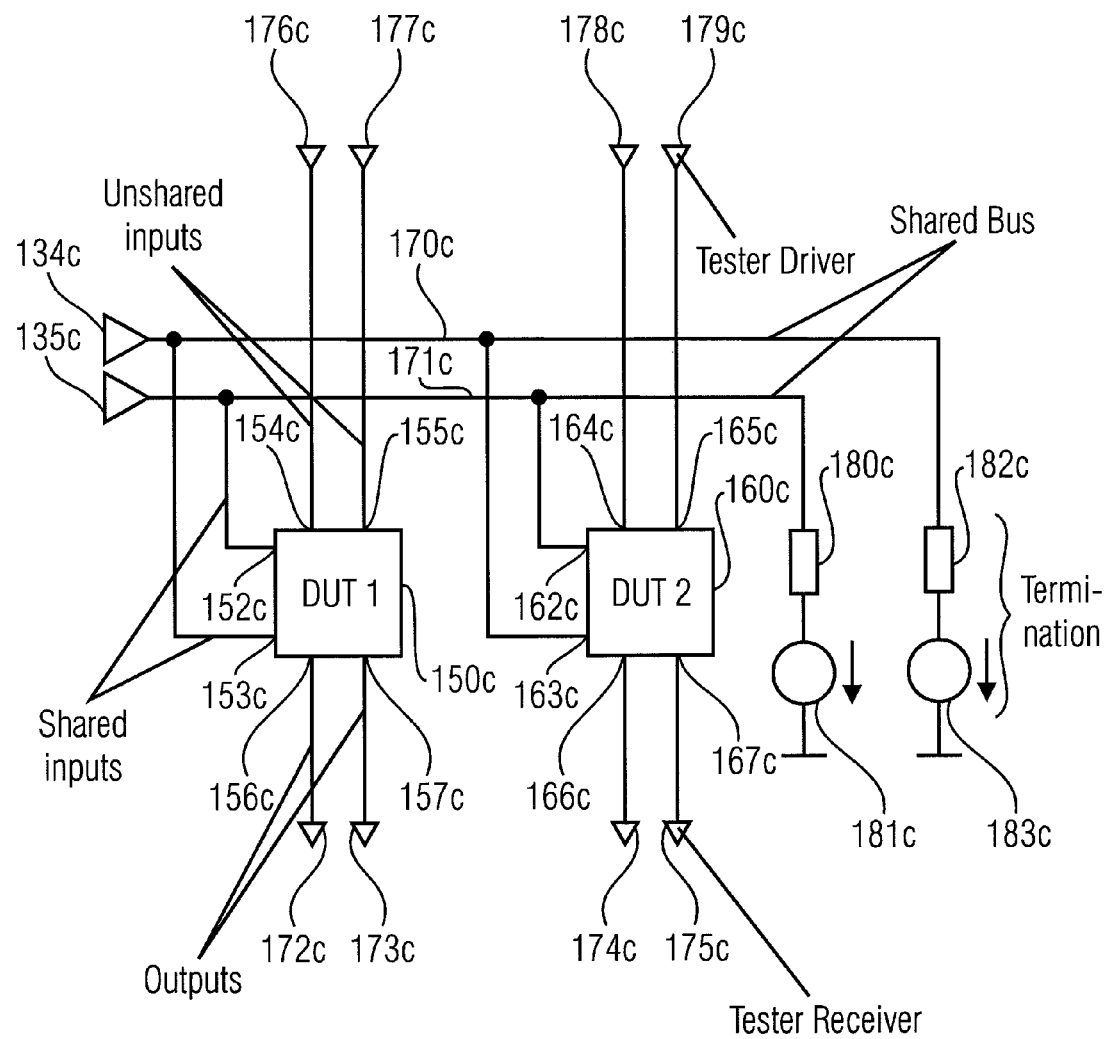

FIG. 2c shows a graphical representation of another dut configuration, which may, for example, be used for testing high speed duts. FIG. 2c shows a configuration in which some of the input pins of the duts are shared and in which each dut further comprises at least one unshared input and at least one unshared output. A first dut 150c comprises a first shared input 152c, a second shared input 153c, a first unshared input 154c, a second unshared input 155c, a first output 156c and a second output 157c. Similarly, a second dut 160c comprises a corresponding first shared input 162c, a second shared input 163c, a first unshared input 164c, a second unshared input 165c, a first output 166c, and a second output 167c. The first shared input 152c of the first dut 150c and the first shared input 162c of the second dut 160c are both connected, using a first shared bus line 170c, with a first output channel 134c of the chip tester. Similarly, the second shared input 153c of the first dut 150c and the second shared input 163c of the second dut 160c are both connected with an output channel 135c of the chip tester using a second shared bus line 171c. Moreover, the first output 156c of the first dut 150c is connected with a first input channel 172c of the chip tester, the second output 157c of the first dut 150c is connected with a second input channel 173c of the chip tester, the first output 166c of the second dut 160c is connected with a third input channel 174c of the chip tester and the second output 167c of the second dut 160c is connected with a fourth input channel 175c of the chip tester. The first unshared input 154c of the first dut 150c is connected with a third output channel 176c of the chip tester, the second unshared input 155c of the first dut 150c is connected with a fourth output channel 177c of the chip tester, the first unshared input 164c of the second dut 160c is connected with a fifth output channel 178c of the chip tester and the second unshared input 165c of the second dut 160c is connected with a sixth output channel 179c of the chip tester.

To summarize, each of the duts 150c, 160c comprises at least 1 (in the example: 2) shared inputs, wherein a shared input of the first dut 150c and a shared input of the second dut 160c are connected to the same output channel of the chip tester. Outputs of the duts 150c, 160c are connected individually to input channels of the chip tester. The input channels comprise respective tester receivers. In general, it should be noted that at least one output of the first dut 150c is connected to an input channel of the chip tester. Moreover, the duts 150c, 160c comprise at least 1 (in the example: 2) unshared inputs, which are connected individually to corresponding output channels of the chip tester. In other words, there is at least one output channel of the chip tester, which is cabled to an input of only one device under test out of the first device under test and the second device under test. Such an output channel of the chip tester in the following will also be designated as an unshared test channel. It should be noted that a first unshared test channel of the chip tester is connected to an input terminal of the first device under test 150c but not to an input terminal of the second device under test 160c, and that a second unshared test channel of the chip tester is connected to an input terminal of the second device under test 160c but not to an input terminal of the first dut 150c.

In the present document, a tester output channel is also briefly designated as tester driver. A tester input channel is briefly designated as tester receiver.

Moreover, it should be noted that the shared bus lines 170c, 171c are optionally terminated. A termination of a shared bus line 170c, 171c can, for example, comprise a termination resistance 180c, 182c. Moreover, the termination may optionally further comprise a termination voltage source 181c, 183c.

In the following, architectural impacts of driver sharing on a fixture delay calibration will be described with reference to FIG. 2c.

It should be noted here that, in an embodiment, the structures shown in FIGS. 2a, 2b and 2c may be implemented on a device under test board (dut board), wherein the connections between the channels of the chip tester and the duts comprise transmission lines, routed on the dut board, and electrical connectors adapted to provide an electrical connection between the dut board and terminals of the duts. Electrical connectors may, for example, be test sockets for providing a detachable electrical connection. The electrical connectors may also comprise nails or tips adapted to provide an electrical connection. However, any other types of connectors may be used. When driver sharing (i.e. connecting input terminals of multiple duts to a single, shared output channel of a chip tester) is implemented on a dut interface (or dut board), two categories of device input pins or device input terminals may be distinguished: input pins (or input terminals) connected to unshared tester driver channels or unshared tester output channels (so-called unshared dut inputs) and input pins (or input terminals) connected to shared tester driver channels or shared tester output channels (so-called shared dut inputs). In an embodiment, the receiver channels are not shared. Unshared inputs of a device (or dut) are conventional input pins that are connected 1:1 to a tester driver channel or tester output channel. Assuming the so-called "daisy chain sharing", shared inputs of a device are connected to lines of a shared bus. In an embodiment, the shared inputs of a group of N devices are connected to one shared bus (or shared bus line). In an embodiment, each line of the shared bus is connected to one tester driver channel. Therefore, in an embodiment, one tester driver channel drives N shared inputs. In another embodiment, multiple shared buses may exist on a dut interface (or dut board) to accommodate the parallel testing of M devices. A number K of shared buses on an interface (or dut board) is, therefore, K=M/N. N is also called "sharing factor".

In an embodiment, the lines of a shared bus are operated as terminated transmission lines to achieve high speed. The N shared inputs connected to one line of the bus form taps to the transmission line. Even though the shared inputs are operated in a high impedance mode, in an embodiment of the invention (for example, with on-die termination off for devices with on-die termination ODT on shared inputs) each input comes with a parasitic load which causes distortions on the signals that propagate along the shared bus. Therefore, in an embodiment of the invention, when driver sharing is implemented to test memory devices, only the lower speed signals, such as command and control inputs, are operated as shared inputs. However, the concept may also be used with other devices.

A driver sharing by-2 implementing the principle described above is illustrated in FIGS. 2a, 2b and 2c.

According to an embodiment of the present invention, a dut interface or dut board that implements driver sharing for a memory device contains K socket boards for N devices on each board. Therefore, each of said socket boards implements one shared bus. Thus, the shared bus as well as unshared inputs of a device are connected to a mother board with cables (wherein the motherboard may provide the connection between the cables and channel modules of the chip tester). Due to a high data rate of the duts and the relatively long signal path, a fixture delay calibration is performed to compensate the propagation delays induced by the long signal path on the interface (or dut board). However, the existence of the shared bus on the socket board (or dut board) has to be taken into account when performing the fixture delay calibration. If, for example, the fixture delay for the first dut (DUT 1) is measured and stored for the shared and unshared inputs of the dut and for the outputs of the dut, the fixture delay values for the driver channel driving the shared bus are only valid for the first dut (DUT 1). In the above context, the term "fixture delay value" may designate a propagation delay between chip tester ports (also designated as chip tester contact elements) of the dut board and dut terminals (or dut contact elements) of the dut board. Alternatively, the term "fixture delay value" may also designate a total propagation delay between a chip tester channel port and a dut terminal (or dut contact element) of the dut board. However, for a second device under test (DUT 2), an additional delay occurs caused by the propagation delay of the signals on the shared bus from the first device under test (DUT 1) to the second device under test (DUT 2).

However, it is not obligatory to use the fixture delay of the first device. Alternatively the fixture delay of the second, third or N-th device could be used as well.

In an embodiment of a chip tester, only one fixture delay value is possible for the driver channel driving the shared bus, and an additional delay on the bus is compensated by other means.

Figure 3:
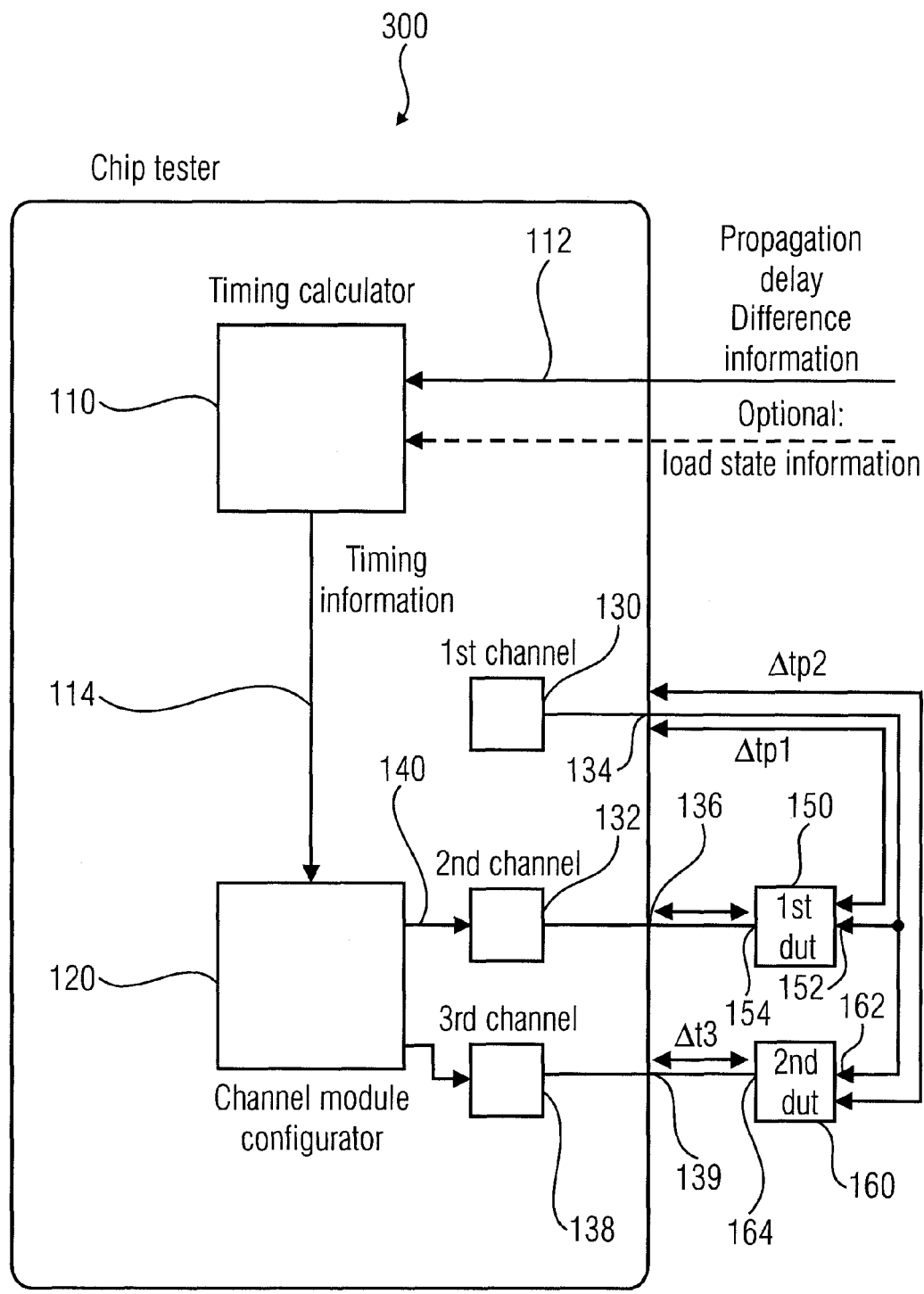
FIG. 3 shows a block schematic diagram of a chip tester, connected to two devices under test, according to an embodiment of the present invention.

In the following, a concept of compensating different propagation delays on a shared line will be described. For this purpose, reference is taken to the architecture shown in FIG. 3. FIG. 3 shows a block schematic diagram of a chip tester connected to two devices under test. The chip tester in FIG. 3 is designated in its entirety with 300. It should be noted that the chip tester 300 is similar to the chip tester 100 of the FIG. 1. For this reason, same means and signals are designated with the same reference numerals and will not be explained here again. Instead, reference is taken to the description of the FIG. 1. However, the chip tester 300 also comprises a third channel 138. A third channel port 139 is associated with the third channel 138. Moreover, it should be noted that the second channel port 136 is in an embodiment connected with a second terminal 154 of the first dut 150. Similarly, the third channel port 139 is connected with a second terminal 164 of the second dut 160. It should be noted that in an embodiment the first dut 150 is of the same type as the second dut 160. In other words, the first dut 150 and the second dut 160 may, for example, be two samples out of a set of chips which are assumed to be identical under ideal circumstances. Moreover, it should be noted that the second channel 132 and the third channel 138 may either both be input channels or may both be output channels. The definition "output channel" comprises an input/output channel configured (e.g. by means of software or by means of a hardware switch) to act as an output port. Similarly, the term "input channel" comprises an input/output channel configured to act as an input port.

Moreover, a propagation delay between a first channel port 134 and the first terminal 152 of the first dut 150 is designated with $\Delta tp1$. A propagation delay between the first channel port 134 and a first terminal 162 of the second dut 160 is designated with $\Delta tp2$. A propagation delay between a second channel port 136 and the second terminal 154 of the first duty 150 is designated $\Delta t2$. A propagation delay between the third channel port 139 and the second terminal 164 of the second dut 160 is designated $\Delta t3$.

In the following, it will be assumed that the second dut terminal 154 of the first dut 150 and the second terminal 164 of the second dut 160 are input terminals. Naturally, the duts 150, 160 may also comprise output terminals, but the output terminals are not shown here for the sake of simplicity. Consequently, it is assumed that the second channel 132 and the third channel 138 are driver channels. Moreover, it is assumed that the propagation delays $\Delta tp1$, $\Delta tp2$, $\Delta t2$, $\Delta t3$ are known to the chip tester. For example, the chip tester may be adapted to read a file comprising said propagation delay values. Alternatively, the chip tester may, for example be adapted to perform a time domain reflection (TDR) measurement in order to determine said propagation delay values. However, in an embodiment of the present invention, the chip tester is adapted to primarily obtain a propagation delay difference information 112. The propagation delay difference information 112 describes the difference between the propagation delay $\Delta tp2$ and propagation delay $\Delta tp1$. Consequently, the timing calculator 110 calculates the timing information 114 defining the relative timing of the second channel 132 and the third channel 138. A time shift between the timing of the second channel 132 and the third channel 138 is adjusted in dependency on the propagation delay difference information 112. In other words, a relative time shift between the signal outputs of the second channel 132 and the third channel 138 is adjusted by taking into consideration the propagation delay difference information, i.e. the difference $\Delta tp2-\Delta tp1$. However, the timing calculator 110 may in an alternative embodiment consider further information, for example, the propagation delay values $\Delta t2$ and $\Delta t3$, when calculating timing information 140 for a relative timing of the second channel 132 and the third channel 138. However, the propagation delay values $\Delta t2$ and $\Delta t3$ may be neglected for the determination of a relative timing between the second channel and the third channel if said propagation delay values are approximately identical, which may, for example, be reached by an appropriate routing of the non-shared connections for the second terminal 154 of the first dut 150 and the second terminal 164 of the second dut 160. Moreover, the timing calculator 110 may optionally (but not necessarily) be adapted to calculate a timing information for the first channel 130. By providing the timing information for the channels 130, 132, 138, a specific relative timing of the different input signals to the first dut 150 and the second dut 160 can be adjusted.

Figure 4A:
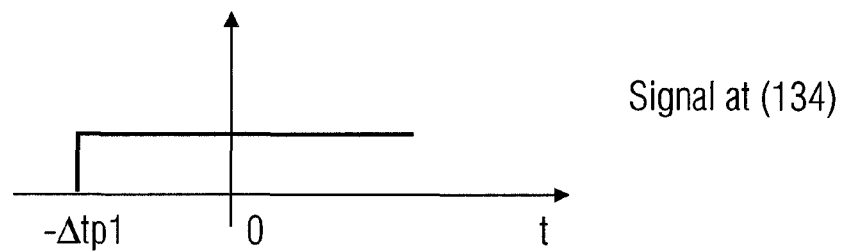
FIG. 4a shows a graphical representation of an exemplary wave form, which may be present at a channel port of a chip tester according to an embodiment of the present invention.
Figure 4B:
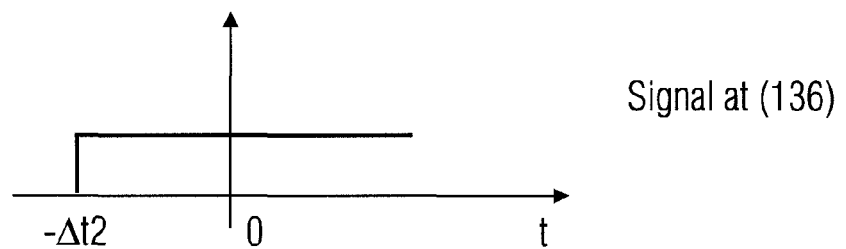
FIG. 4b shows a graphical representation of an exemplary wave form, which may be present at a channel port of a chip tester according to an embodiment of the present invention.
Figure 4C:
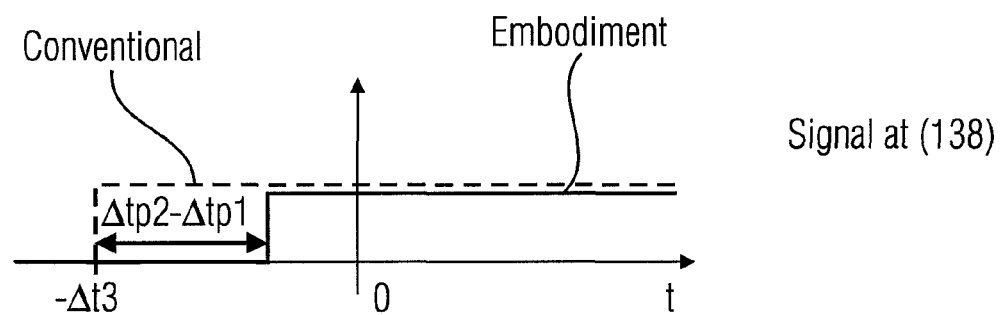
FIG. 4c shows a graphical representation of an exemplary wave form, which may be present at a channel port of a chip tester according to an embodiment of the present invention.

FIGS. 4a, 4b and 4c describe a setting of timings, which may be used in an embodiment of the invention.

In the following, it will be assumed that the time reference t=0 is set to designate the time when the signals arrive at the first dut 150. However, this is naturally an arbitrary choice, and a different time reference could be chosen.

In an exemplary embodiment, all signals (e.g. edges or transitions) should arrive at the first dut 150 at a time t=0. Accordingly, the tester may send the corresponding signals earlier. As shown in FIG. 4a, the tester may provide a signal transition at the first channel port 134 at a time t=−$\Delta tp1$. As shown in FIG. 4b, the tester may provide a signal transition at the second channel port 136 at time t=−Δt2.

At the second dut 160, the signal from the shared driver 130 arrives at t=Δtp2−Δtp1. In other words, the signal form the shared driver 130 arrives at the second dut 160 later by a propagation delay difference (Δtp2−Δtp1) than it arrives at the first dut 150.

Normally, the chip tester would provide a signal (or signal transition) at the third channel 138 at t=−Δt3 to make it arrive at the second dut 160 at time t=0. However, according to an embodiment of the invention, the signal provided by the third channel 138 is delayed by (Δtp2−Δtp1) to make it arrive at the same time as the shared signal from the shared driver 130, namely at t=Δtp2−Δtp1.

FIG. 4c shows the signals provided by the third channel 138.

A time difference between the signal provided by the first channel 130 at the first channel port 134 and the signal provided by the second channel 132 at the second channel port 136 is $$-\Delta t2 + \Delta tp1.$$

A time difference between the signal provided by the third channel 138 at the third channel port 139 and the signal provided by the second channel 132 at the second channel port 136 is $$-((\Delta tp2 + \Delta tp1) + \Delta t3 - \Delta t2).$$

Figure 4D:
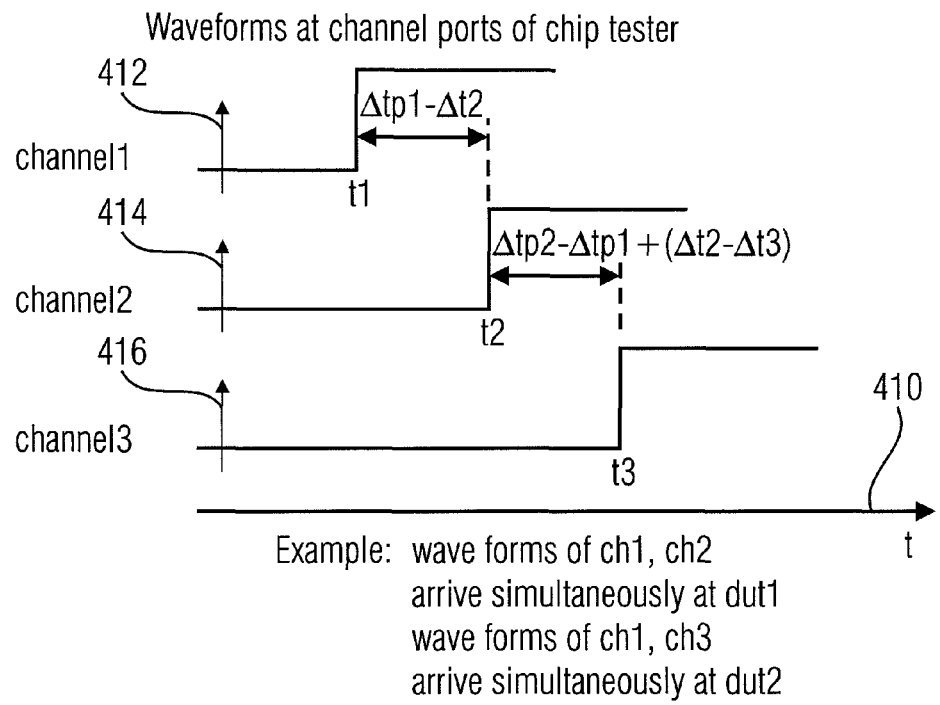
FIG. 4d shows a graphical representation of exemplary wave forms, which may be present at the channel ports of a chip tester according to an embodiment of the present invention.
Figure 4E:
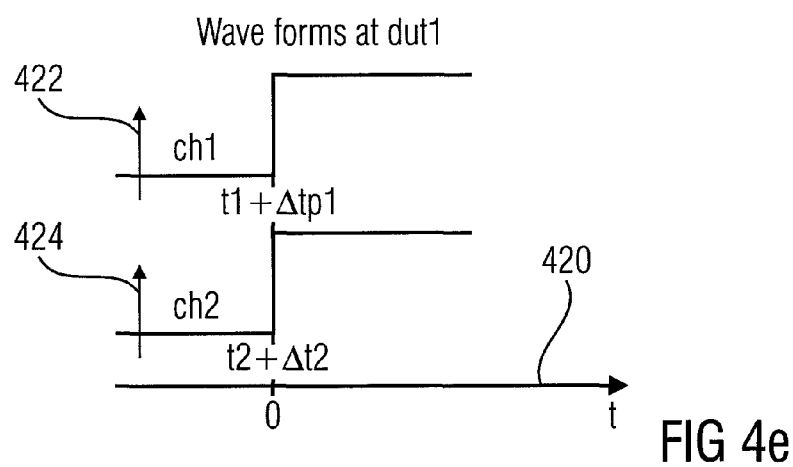
FIG. 4e shows a graphical representation of exemplary wave forms, which may be present at terminals of the first device under test according to an embodiment of the present invention.
Figure 4F:
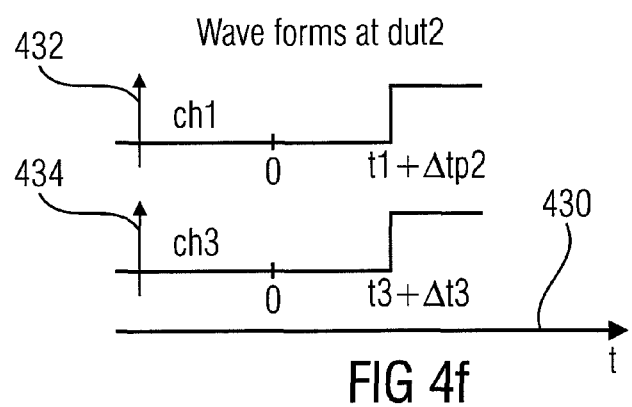
FIG. 4f shows a graphical representation of exemplary wave forms, which may be present at terminals of the second device under test according to an embodiment of the present invention.

FIGS. 4d, 4e and 4f describe another advantageous setting of the timings. It should be noted here that in order to provide a sufficient synchronism of the input signals of the first dut 150 and the second dut 160, it is sufficient for the timing calculator to know the propagation delay difference information 112, i.e. Δtp2−Δtp1. In a basic embodiment, the timing calculator 112 can then provide timing information 114, which directs the channel module configurator 120 to introduce a time shift identical to the propagation delay difference information between the timings of the third channel 138 and the second channel 132. Thus, the timing calculator 110 provides timing information to the channel module configurator 120 which results in a timing configuration of the third channel 138 and the second channel 132, such that the third channel 138 provides the same signal pattern as the second channel 132, wherein the signal pattern provided by the third channel 138 is delayed with respect to the signal pattern provided by the second channel 132 by (Δtp2−Δtp1). This case is illustrated in FIG. 4d. In an embodiment, the relation Δt2=Δt3 may be fulfilled. However, if the timing calculator 112 further receives (optional) information about Δt2 and Δt3, the timing calculator may provide the timing information 114 taking into consideration Δt2 and Δt3. In this case, a time shift between the signal patterns provided by the second channel 132 and the third channel 138 is adjusted to $$\Delta tp2 - \Delta tp1 + \Delta t2 - \Delta t3.$$

In a more advanced embodiment, the timing calculator 110 may additionally be adapted to provide the timing information to set a timing relationship between the first channel 130 and the second channel 132. For this setting, it is obligatory that the timing calculator receives an information about the propagation delay Δtp1 and the propagation delay Δt2. However, it is worthwhile noting that by adjusting the relative timing of the second channel 132 and the third channel 138 merely making use of the propagation delay difference information Δtp2−Δtp1 (and, optionally, a propagation delay time information Δt2−Δt3) the timing of the second channel 132 and the third channel 138 can be adjusted such that both duts 150 and 160 receive corresponding signals with the same timing relationship.

In an embodiment of the present invention, the timing calculator 110 is adapted to receive the propagation delay difference information Δtp2−Δtp1, the propagation delay information Δtp1, the propagation delay information Δt2 and either information about Δt2−Δt3 or the information Δt3 itself. Based on this information, the timing calculator 110 is adapted to set the timings of the three channels 130, 132, 138 as shown in FIG. 4d. In other words, the timing calculator is adapted to provide timing information to delay the second channel 132 by Δtp1−Δt2 with respect to the first channel 130. Moreover, and more importantly, the timing calculator 110 is adapted to provide timing information 114 to adjust a timing of the third channel 138 and the second channel 132, such that the timing of the third channel is delayed with respect to the timing of the second channel by Δtp2−Δtp1, or by Δtp2−Δtp1+Δt2−Δt3.

Such a setting of the timings of the channels 130, 132, 138 has the effect that the wave forms output by the first channel and the second channel arrive simultaneously at the first dut 150 and that the wave forms output by the first channel and the third channel arrive simultaneously at the second dut 160.

It should be noted here that the graphical representation of FIG. 4d describes the wave forms output by the first channel 130, the second channel 132 and the third channel 138 as a function of time. An abscissa 410 describes a time and ordinates 412, 414, 416 describe the respective signals in terms of arbitrary units. Timing shifts between the output signals of the first channel 130, the second channel 132 and the third channel 138 are also shown in the graphical representation of FIG. 4d.

FIG. 4e shows a graphical representation of wave forms arriving at the first device under test 150 in response to the output wave forms of the first channel 130, the second channel 132 and the third channel 138 shown in FIG. 4d.

An abscissa 420 describes the time and ordinates 422, 424 describe the signals present at the input terminals 152, 154 of the first dut 150 in terms of arbitrary units.

It should be noted here that for the timing of the output signals of the first channel 130 and the second channel 132 as shown in FIG. 4d, the corresponding signals arrive at the input terminals 152, 154 of the first dut 150 simultaneously. In other words, the signals at the input terminals 152, 154 of the first dut 150 are in a specific relative timing relationship (here: simultaneous arrival).

Taking reference now to FIG. 4f, the timing at the input terminals 162, 164 of the second dut 160 will be described. An abscissa 430 describes the time and ordinates 432, 434 describe the signals at the input terminals 162, 164 at the second dut 160. It should be noted here that for the timing of the first channel 130 and the third channel 138 shown in FIG. 4d, the signals at the input terminals 162, 164 of the second dut 160 arrive simultaneously. In other words, the signals arriving at the input terminals 162, 164 are in a specific relative timing relationship (here: simultaneous arrival). However, it should be noted that relative timing relationships between, on the one hand, the signals at the input terminals of the first dut 150 and, on the other hand, between corresponding signals at the input terminals of the second dut 160, are identical, provided that the relative timing relationship between the second channel 132 and the third channel 138 are adjusted as described above. In other words, if for example the first dut is configured to receive two edges on two different signals delayed with respect to each other by a given time, the second dut will also receive two edges on two different signals delayed with respect to each other by the same given time.

To summarize the above, it can be noted that, according to one embodiment of the present invention, it is actually possible that relative timings of the signals arriving at two different duts are identical, provided that a relative timing of two channels of the chip testers (here: the second channel 132 and the third channel 138) is adjusted in dependence on the propagation delay difference information 112 (here: $\Delta tp2-\Delta tp1$). Adjusting the relative timing of two channels, one of which provides and unshared signal to the first dut 150 and one of which provides and unshared signal to an input terminal of the second dut 160, taking into account the propagation delay difference information about a difference of propagation delays on a shared line connected to both duts 150, 160 allows for an elimination of the impact of the propagation delay difference on the shared line. Consequently, a relative signal timing present at the first dut 150 is identical to a relative signal timing of signals present at the second dut 160. Thus, both duts 150, 160 are tested under identical (relative) timing conditions. For this reason, identical test results can be expected for the first dut 150 and the second dut 160, provided the duts 150, 160 are identical.

As a result, an embodiment of the present invention allows a quasi-simultaneous (i.e. almost simultaneous but shifted by $\Delta tp2-\Delta tp1$) testing of two devices making use of both shared inputs and unshared inputs or unshared outputs. Even high speed devices can be tested making use of the inventive concept, according to an embodiment of the present invention.

Taking reference to FIGS. 4d, 4e and 4f, a configuration has been described in which the second channel and the third channel act as output channels or tester driver channels. However a similar configuration is also usable if the second channel 132 and the third channel 138 act as input channels.

In the following, it is therefore assumed that the second terminal 154 of the first dut 150 is an output terminal and that the second terminal 164 of the second dut 160 is also an output terminal.

Figure 5:
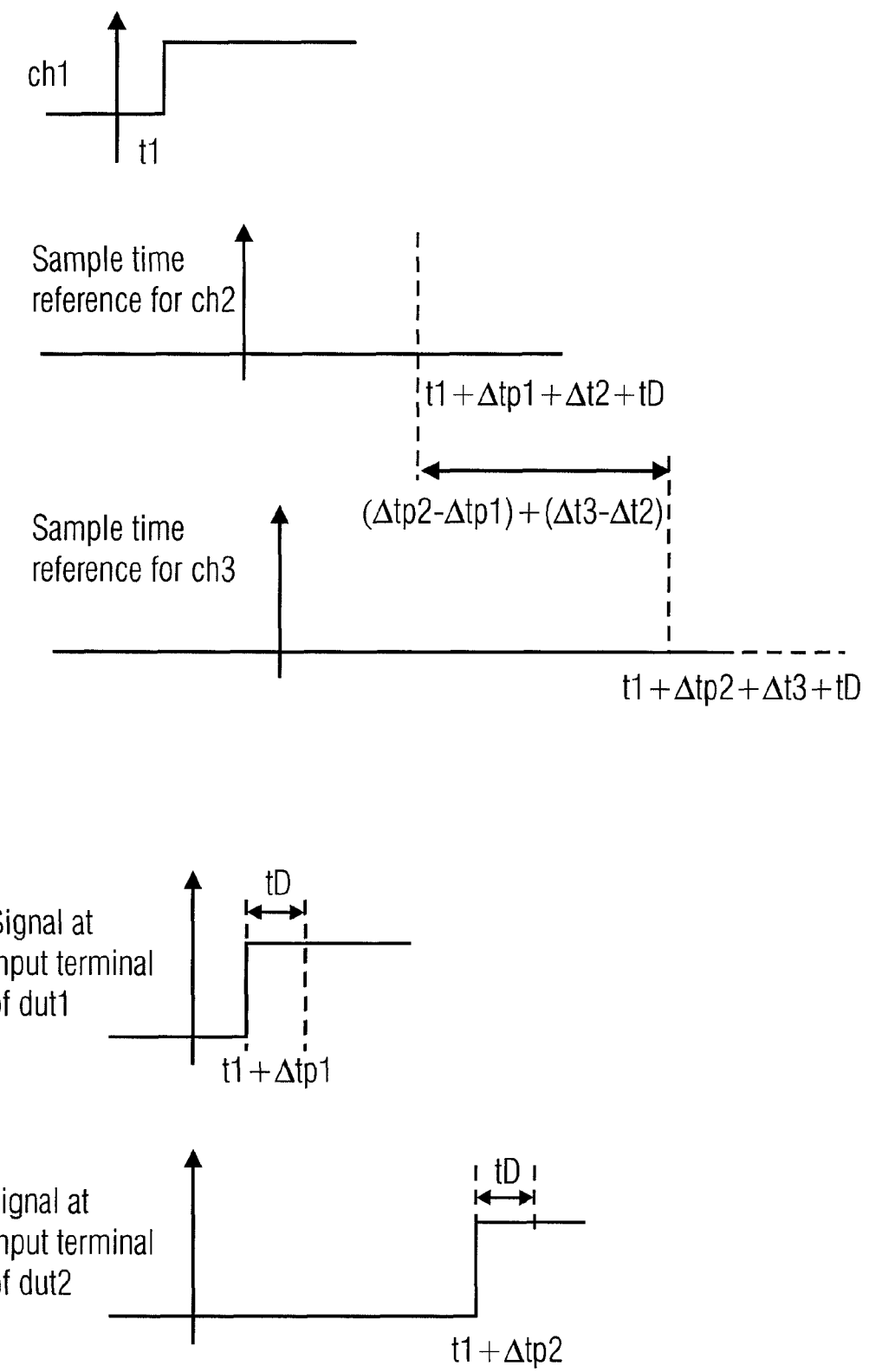
FIG. 5 shows a graphical representation of an output wave form and a sample reference time, which may be present in a chip tester according to an embodiment of the present invention.

Moreover, in an embodiment, the timing of the second channel 132 and of the third channel 138 are adjusted by the channel module configurator 120 in response to the timing information 140 provided by the timing calculator 110. It should be noted that in an embodiment of the present invention, the timing of the third channel 138 is delayed with respect to a timing of the second channel 132 by $\Delta tp2-\Delta tp1$. In another embodiment, the timing of the third channel 138 is delayed with respect to the timing of the second channel 132 by $\Delta tp2-\Delta tp1+\Delta t3-\Delta t2$. In other words, the timing of the third channel 138 is delayed with respect to the timing of the second channel on the basis of the propagation delay difference information. An example timing of a corresponding chip test set up is shown in FIG. 5. In other words, FIG. 5 shows a graphical representation of signals and timings which may be present in the chip tester 300 of FIG. 3 according to an embodiment of the present invention. It is assumed here that the first channel 130 provides a signal wherein a signal transition arrives at the first channel port 134 at time t1. The signal transition arrives at the first dut 150 at time t1+$\Delta tp1$ and at the second dut at time t1+$\Delta tp2$. Moreover, the second channel 132 is adapted to sample an output signal of the first dut 150 at time t1+$\Delta tp1$+$\Delta t2$+tD. Similarly, the third channel 138 is configured to sample a signal provided by the second dut 160 at the time t1+$\Delta tp2$+$\Delta t3$+tD. It should be noted here that the timing shift between the second channel 132 and the third channel 138 has been configured by the timing calculator 110 and the channel module configurator 120 on the basis of the propagation delay difference information 112.

As a consequence, the second channel effectively determines a signal, which is present at the output 154 of the first dut 150 when a time tD has elapsed after the transition of the input signal of the first dut 150. Similarly, the third channel 138 evaluates a signal which is present at the output 164 of the second dut 160 when a time tD has elapsed after a transition of the input signal of the second dut 160.

In other words, the above described shift of the timings of the second channel 132 and the third channel 138 has the effect that corresponding output signals of the duts 150, 160 are sampled, occurring at identical relative timing positions with respect to the respective input signals of the duts 150, 160.

Thus, the above described configuration of the second channel 132 and the third channel 138 has the effect that identical duts 150, 160 produce identical test results despite the propagation delay difference $\Delta tp2-\Delta tp1$, even in a high speed test environment.

In the following, a concept will be described which allows the implementation of the adjustment of the timings of multiple channels in a shared line test architecture, making use of a conventional fixture delay calibration. In order to facilitate the understanding of an embodiment of the present invention, the concept of fixture delay calibration will be outlined in the following.

Fixture delay calibration is a dedicated tool to compensate delays along a signal path of an interface or a dut board (e.g. between a channel port of a tester channel and a dut terminal, or between a channel port of a tester channel and a dut connection element for connection of a dut). For this reason, an embodiment of the present invention comprises a concept (i.e. a method or an apparatus) that is based on the fixture delay calibration.

An original purpose of the fixture delay calibration is to establish a timing reference (t=0) at dut contact elements (e.g. at pins of a DUT socket). However, when driver sharing is implemented (e.g. when input terminals of multiple duts are connected to a single chip tester output channel) this can be achieved only for one dut connected to a shared bus. In other words, in an embodiment of the present invention, a timing reference of t=0 can only be established for one single dut out of a plurality of duts connected to a shared line.

However, it has been found that for testing devices on a shared bus, it is not obligatory to establish a timing reference with t=0 for all duts individually at the dut contact elements (e.g. at the pins of the device sockets). Rather, according to an embodiment of the present invention, it is sufficient to just guarantee synchronism, which means that the stimulus of all inputs of one dut arrive at the same point in time (which may be different from zero) and that a compare action for one dut is performed relative to this point in time.

With this simplification, it is no longer needed to maintain several different fixture delay values for the shared inputs. Instead, it is possible to use only one fixture delay value for each shared input of all duts. However, the timing for the unshared input and the outputs of each individuals dut is, according to one embodiment, adapted such that they remain synchronized with the shared inputs. This is equivalent to establishing one and the same timing reference for all duts connected with one shared bus at an arbitrary location. Therefore, the fixture delay calibration can still be used to compensate the propagation delay caused by the dut interface, even when driver sharing is implemented. According to an embodiment of the present invention, it is only needed that the fixture delay values measured are modified to ensure synchronism for all duts. This can be achieved by an additional tool performing a post-processing on the fixture delay calibration files.

Regarding the fixture delay calibration, it should be noted that the chip tester, according to one embodiment of the present invention, is adapted to obtain information about a propagation delay between the channel port of the tester and a terminal of a dut. If the chip tester obtains the information that there is a certain delay between a certain channel port and a certain dut terminal, the chip tester configures the timing of the respective chip tester channel accordingly. If the chip tester channel is an output channel, the chip tester will advance the timing of the respective channel with respect to a reference timing in order to compensate for the propagation delay. If the channel is an input channel, the chip tester will delay the timing of the input channel with respect to a reference timing in order to compensate for the propagation delay. It should be noted here that the reference timing may, for example, be a timing under the assumption that there is no delay present between the channel port and the dut terminal.

In the following, details of a proposed fixture delay calibration method according to an embodiment of the present invention will be described. Firstly, a compensation of propagation delays according to an embodiment of the present invention will be described. When testing any devices under test (e.g. when testing memory devices) with driver sharing, a fixture delay measurement is performed using a short circuit device inserted into a dut socket (or dut connection element) instead of an actual device. Subsequently, a time domain reflection measurement is made by providing an excitation signal to a chip tester port (or chip tester connection element) of the dut board and by measuring a response signal at the dut port (or dut connection element). There are two reasons for using a short (or short circuit device) for the measurement instead of an open (or an open circuit). The first reason is the fact that the DQ lines (or shared lines, or data lines) are configured as dual transmission lines and that the location of the dut terminal (or dut pin or dut connection element) can only be identified with a short at that point. The second reason is the fact that the shared bus also behaves like a dual transmission line when we look at it from the perspective of one dut.

Measuring the fixture delay values in the aforementioned way for a driver sharing interface (or a dut board), therefore, means to insert a short circuit device into the first dut or dut socket, to measure the fixture delay and store it into a first file (file 1), then insert the short circuit device into the second dut (dut 2) (or into a second dut socket), to measure the fixture delay and store it into a second file (file 2). In an embodiment, the measurements are repeated, placing a short circuit device into the different dut sockets subsequently, until a measurement of a N-th dut (DUT N) is stored in a N-th file (file N). The different fixture delay calibration files represent different delays for the shared inputs depending on which dut socket was loaded with the short circuit device plus the delays of the unshared inputs and the outputs that belong to the same dut.

However, it should be noted that it is not needed to save the results of all the measurements into separate files. In contrast, a single file or any other appropriate data structure could be used.

According to an embodiment of the present invention, a way to compensate the different signal paths for the individual duts on the shared bus in a single fixture delay file is as follows:

Start with the result of a conventional fixture delay calibration for all duts (or at least for a subset of duts of interest), stored in N fixture delay calibration files (or in any other appropriate data structure), wherein N is the sharing factor. According to an embodiment of the present invention, these files are supplied from the interface manufacturer who performs this measurement after manufacturing (the interface or the dut board) using time domain reflection (TDR) equipment. However, the N fixture delay calibration files can also be generated with a fixture delay calibration tool contained in the "SmarTest" software provided by the applicant.

The next step is to compensate the signal path to the first dut in a conventional way, leaving the fixture delay data of the first dut (DUT 1) untouched.

The third step is to compensate the signal path to the other duts on the shared bus (DUT 2 . . . DUT N) by modifying the fixture delay values of the unshared inputs and the outputs.

Finally, the result is merged in a single fixture delay calibration file.

This approach effectively establishes a reference time (T=0) for all duts to the pins or dut contact elements of the first dut socket (or dut connector) (DUT 1). When the reference time is chosen to be the time when the stimulus signals arrive at the shared inputs of the first dut, the same signals arrive at the second dut with an additional delay $\Delta t12$ caused by a signal propagation from DUT 1 to DUT 2 (wherein the relationship $\Delta t12=\Delta tp2-\Delta tp1$ may hold).

It is, however, not needed that the reference T=0 is chosen to be at the pins of the first dut 150 (DUT1). Another embodiment could be to adjust the reference T=0 to DUT2, DUT3 or DUT N, or to another arbitrary point in time.

To ensure that the stimulus signals of the unshared inputs of DUT 2 arrive at the same time as the stimulus signals of the shared inputs, the signals of the unshared inputs of DUT 2 have to be delayed by the same amount $\Delta t12$. Since all input signals are now delayed by the same amount relative to the arrival of the signal at DUT 1, the output of DUT 2 will also be delayed by the same amount $\Delta t12$. Therefore, the compare action taking place in the receiver channels has to be delayed accordingly. When the delay $\Delta t12$ is achieved on the unshared inputs and the outputs of DUT 2, a synchronism will also be guaranteed for DUT 2, and the device can be tested as usual.

The delay of the unshared input signals and the output signals can be achieved by the modification of the respective fixture delay calibration values of each dut. This is possible because, in contrast to the shared inputs, the unshared inputs and the outputs of each dut are connected to individual tester channels. During a post-processing step, the measured fixture delay values of the unshared inputs and the outputs are modified to account for the additional delay $\Delta t12$, relative to the first dut ($\Delta t12$, $\Delta t13$ . . . $\Delta t1N$ if there are N devices on one shared bus).

In order to delay the signals on the unshared inputs by the amount of $\Delta t12$, the respective fixture delay values have to be reduced by $\Delta t12$. The reduced fixture delay values have the consequence that the tester drivers send their stimulus signals later, assuming that the shorter signal path has to be compensated. In order to delay the signals on the dut outputs, the respective fixture delay values have to be increased by $\Delta t12$. The increased fixture delay values have the consequence that the tester receivers perform their compare action later, assuming a longer signal path has to be compensated.

In an embodiment of the present invention, the above described post-processing first analyses the N fixture delay calibration files (or any other data structure, in which the respective propagation delay values are provided) and calculates the difference (or propagation delay difference) between the second dut (DUT 2) and the first dut (DUT 1) for each shared input. The delay $\Delta t12$ is obtained by averaging the differences on all shared inputs. Because of the averaging, in an embodiment of the present invention the lengths of the shared bus between the second dut (DUT 2) and the first dut (DUT 1) are precisely length matched. In the next step, the post-processing subtracts the value Δt12 from the fixture delay value of each unshared input of the second device (DUT 2). It further adds the value Δt12 to the fixture delay value of each output of the second dut (DUT 2) and stores it as a new fixture delay value. The measured fixture delay values of the first dut (DUT 1) are left unchanged. The fixture delay values used for the shared bus are those obtained from measuring the first dut (DUT 1). The post-processing finally combines the new and unchanged fixture delay values for all duts and stores it into a new fixture delay calibration file (or provides any other appropriate data structure). If there are N devices on the shared bus, the procedure is applied for all duts from the second dut (DUT 2) to the N-th dut (DUT N) (i.e. the procedure is applied to DUT 2, DUT 3, . . . DUT N), processing the respective delays Δt12, Δt13, . . . Δt1N in the same way for each dut.

For a typical interface, the values measured for the unshared inputs during fixture delay calibration are dominated by the propagation delay of a cable connecting a socket board (or dut board) with the motherboard. When these values are reduced during post-processing to account for the delay between the first dut (DUT 1) and the N-th dut (DUT N) on the shared bus, the result is typically positive, since the delays on the cables are typically larger than the delays on the traces of the shared board. However, when large sharing factors N are implemented, the delay on the shared bus may exceed the delay on the cable and a negative value may be the result of the post-processing. In this case, an additional offset can optionally be added to the fixture delay values of all inputs and subtracted from the fixture delay values of all outputs before applying the above modification procedure.

The consequence of using an additional offset is just a change of the reference time without affecting the synchronism.

When K shared buses are implemented on an interface to test M=K*N devices in parallel, a conventional fixture delay calibration and the above described post-processing sequence can be performed for the K buses in parallel using K short circuit devices. This means that the first dut (DUT 1) of all shared buses is measured first, followed by the second dut (DUT 2) to the N-th dut (DUT N). Again, N fixture delay calibration files are generated containing the measurement data of all K buses. However, any other appropriate data structure may be generated. During post-processing, Δt12 for all K buses is processed in a first step, followed by Δt13 . . . ΔtN. The result of the post-processing is one new fixture delay calibration file, valid for a whole interface (or for a whole dut board). However, any other appropriate data structure may be created.

The above described post-processing and merging of the N fixture delay calibration files into one fixture delay calibration file valid for a driver sharing interface is currently performed by a script based UNIX tool provided with a "HSM 3600" software. Alternatively, any other software or hardware can be used for the post processing.

Figure 6:
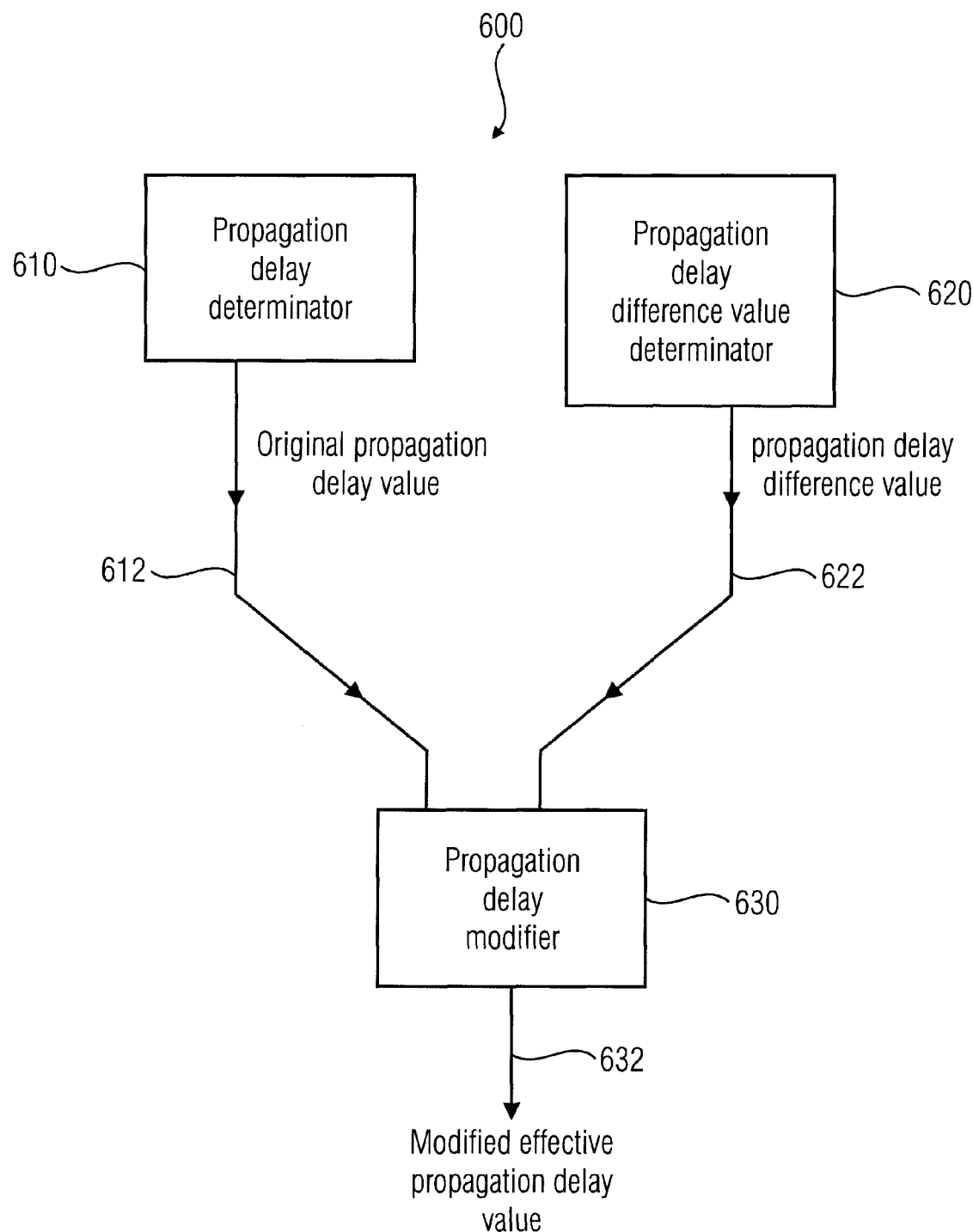
FIG. 6 shows a block schematic diagram of an apparatus for post processing propagation delay values, according to an embodiment of the present invention.

In the following, the general concept of an apparatus for post-processing an original propagation delay value will be described. For this purpose, FIG. 6 shows a block schematic diagram of an apparatus for post-processing an original propagation delay value, according to an embodiment of the present invention. The apparatus of FIG. 6 is designated in its entirety with 600. The apparatus 600 is adapted to post-process a plurality of propagation delay values of a dut interface (or dut board) for a chip tester.

Figure 7A:
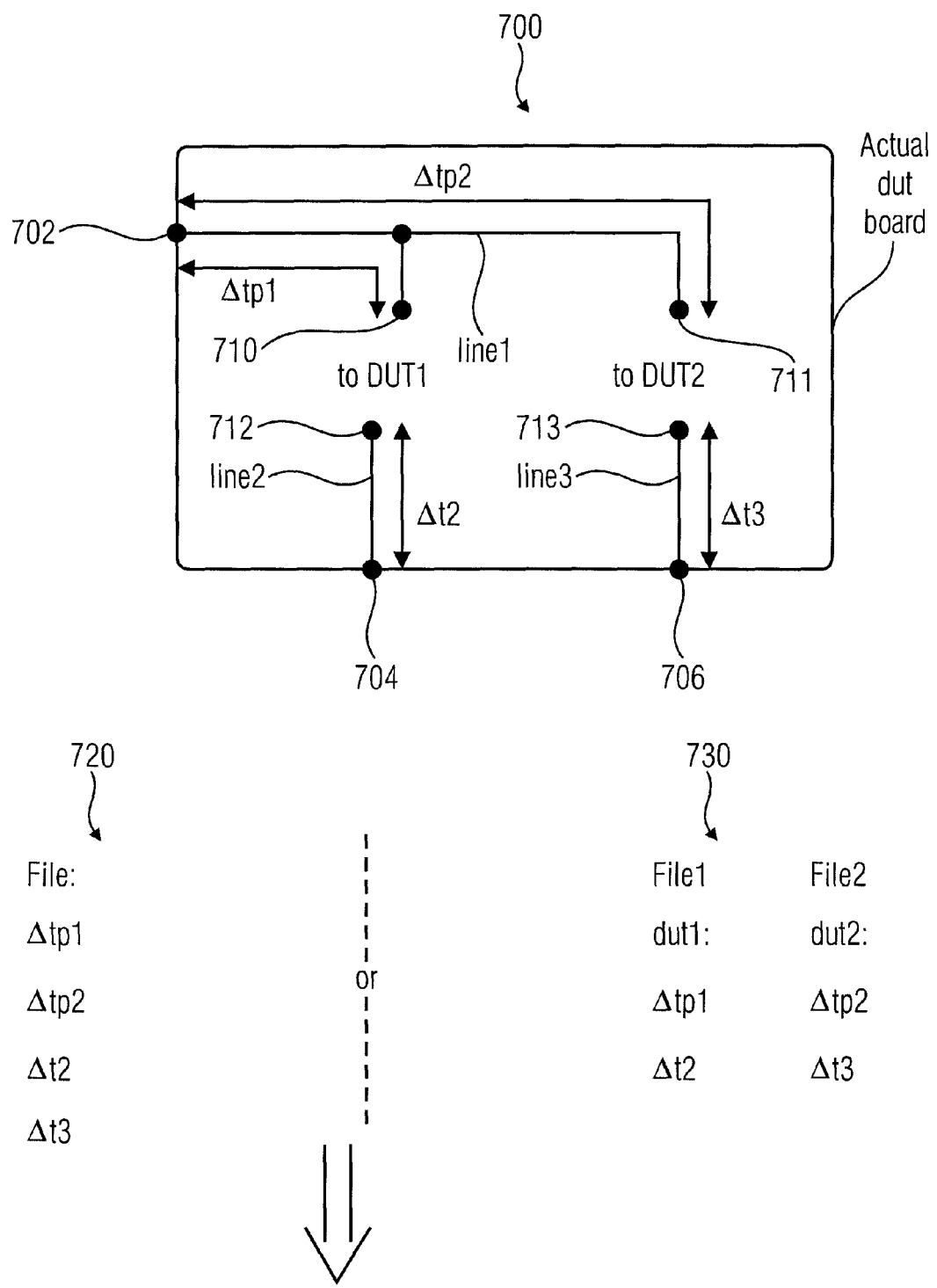
FIG. 7a shows a graphical representation of an actual dut board and possible corresponding original propagation delay value files, according to an embodiment of the present invention.
Figure 7B:
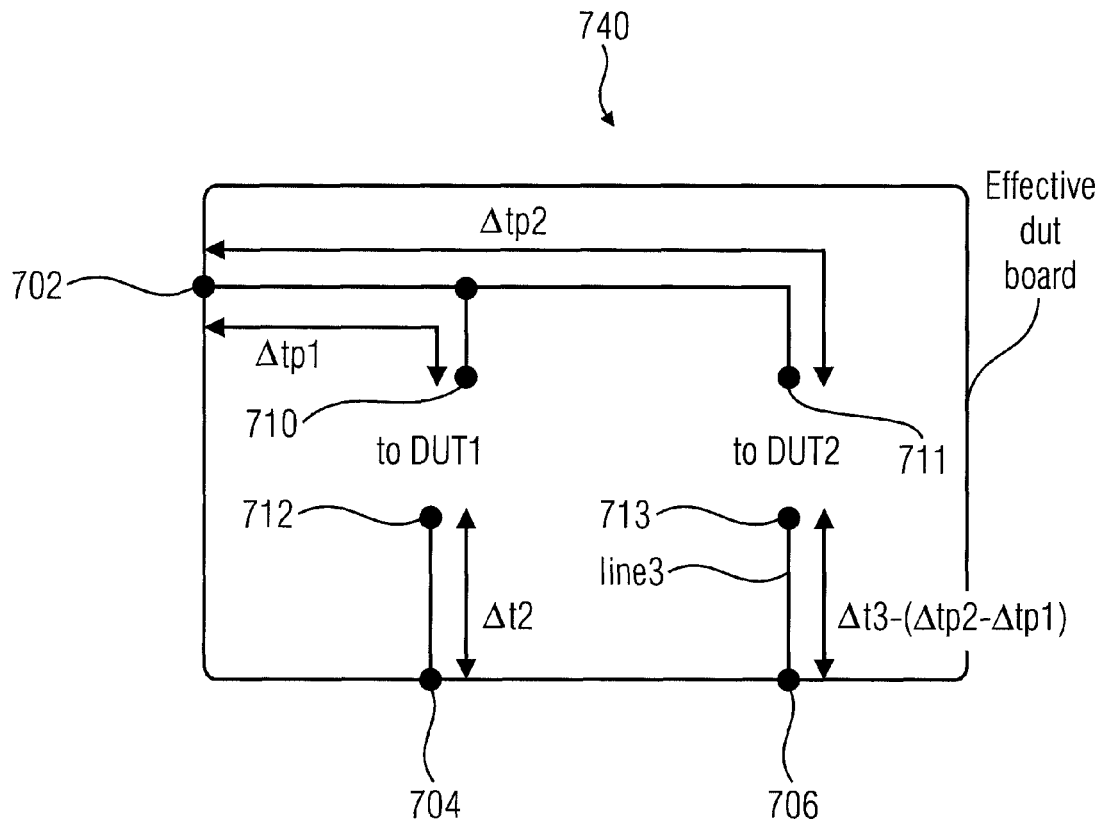
FIG. 7b shows a graphical representation of a possible effective dut board and a possible corresponding effective propagation delay value file, according to an embodiment of the present invention.
Figure 7C:
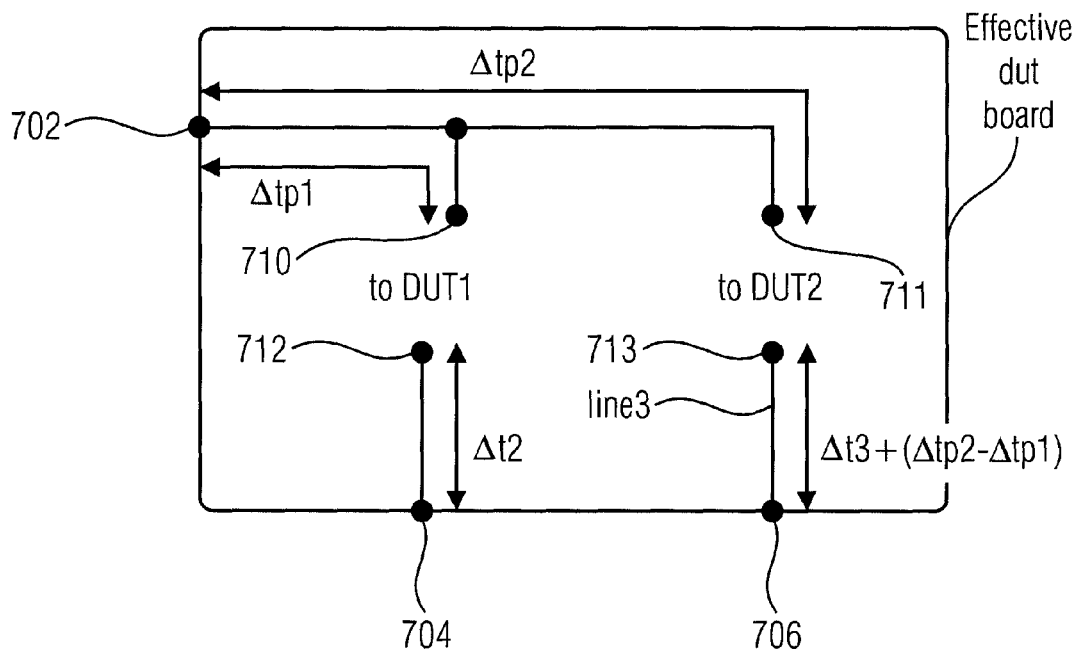
FIG. 7c shows a graphical representation of another possible effective device under test board and possible corresponding effective propagation delay value files, according to an embodiment of the present invention.

It is assumed here, that the dut interface (or dut board) is adapted to provide an electrical connection between a chip tester and at least two duts, and that the dut board comprises a first dut contact element for providing a detachable electrical contact between the dut board and a first dut, a second dut contact element for providing a detachable electrical contact between the dut board and the second dut, a third dut contact element for providing a detachable electrical contact between the dut board and the first dut and a fourth dut contact element for providing a detachable electrical connection between the dut board the second dut. Moreover, it is assumed that the dut board comprises a first chip tester contact element for providing a detachable electrical contact between the dut board and a chip tester. Moreover, it is assumed that the dut board comprises a second chip tester contact element for providing a detachable electrical contact between the dut board and the chip tester, and a third chip tester contact element for providing a detachable electrical contact between the dut board and the chip tester. Moreover, it is assumed that the first dut contact element and the second dut contact element are both electrically connected to the first chip tester contact element. The third dut contact element is electrically connected to the second chip tester contact element, and the fourth dut contact element is electrically connected to the third chip tester contact element. Details regarding a possible dut interface configuration are shown in FIGS. 7a to 7c.

It should be noted that in the present description, a dut board is described as an example of a dut interface. However, other types of dut interfaces for providing a connection between the chip tester and one or more duts can be used.

The apparatus 600 comprises a propagation delay determinator 610, which is adapted to obtain an original (or actual) propagation delay value describing a propagation delay between the fourth dut contact element and the third chip tester contact element. The propagation delay determinator 610 is adapted to provide the obtained propagation delay value as an original propagation delay value 612. Moreover, the apparatus 600 comprises a propagation delay difference value determinator 620, which is adapted to obtain and provide a propagation delay difference 622, describing a difference between, on the one hand, a propagation delay between the first chip tester contact element and the first dut contact element, and, on the other hand, a propagation delay between the first chip tester contact element and the second dut contact element. Moreover, the apparatus 600 comprises a propagation delay modifier 630, which is adapted to modify the original propagation delay value 612 using the propagation delay difference value 622. Consequently, the propagation delay modifier 630 is adapted to provide a modified effective propagation delay value 632.

In an embodiment of the invention, the modified effective propagation delay value 622 may take the place of the original propagation value 612. In an other embodiment of the present invention, the modified effective propagation delay value 622 may, for example, be used as the timing information 140, which serves as an input information for the channel module configurator 120 in the chip tester 100. It should also be noted that the apparatus 600 can be considered to make up the timing calculator 110 of the chip tester 100.

Moreover, it should be noted that in an embodiment, the apparatus 600 is adapted to produce a data structure (for example, a file) on the basis of one or more modified effective propagation delay values 632. Moreover, the apparatus 600 may, in an embodiment, be adapted to process as an input information one or more of the above-described fixture delay calibration files and to produce a new fixture delay calibration file (which may also be designated as a modified fixture delay calibration file, or an effective fixture delay calibration file) on the basis of one or more of the modified effective propagation delay values.

In the following, a typical dut board and a corresponding dut board propagation delay data structure will be described. Subsequently, a processed modified (or effective) dut board propagation delay data structures will be shown. FIG. 7a shows an example of a dut board for a driver sharing test of at least two duts. The dut board of FIG. 7a is designated in its entirety with 700. Moreover, FIG. 7a shows graphical representations of two possible dut board propagation delay data structures, which are designated with 720 and 730. The dut board 700 comprises 3 chip tester contact elements 702, 704, 706. The chip tester contact elements (or chip tester connectors or chip tester ports) are adapted to provide an electrical connection between the chip tester and the dut board 700. The chip tester contact elements may, for example, be contact elements, which are adapted to interact with a POGO interface of a chip tester. Moreover, the dut board 700 comprises 4 dut contact elements 710, 711, 712, 713. The dut contact elements are adapted to provide an electrical contact between the dut board 700 and two duts. In particular, the first dut contact element 710 and the third dut contact element 712 are adapted to provide electrical contacts with two different terminals of a first dut, and the second dut contact element 711 and the fourth dut contact element 713 are adapted to provide an electrical contact to two different terminals of a second dut.

The first and third dut contact elements 710, 712 may, for example, be a part of a first dut socket for the first dut, and the second and fourth dut contact elements 711, 713 may, for example, be part of a second dut socket for a second dut.

Moreover, the first and second dut contact elements 710, 711 are electrically connected to the first chip tester contact element 702 via a shared line. In other words, the first dut contact element 710 and the second dut contact element 711 are both connected to the same chip tester contact element. The connection is performed by a transmission line on the dut board. Moreover, the third dut contact element 712 is electrically connected to the second chip tester contact element 704, and the fourth dut contact element 713 is electrically connected to the third chip tester contact element 706.

Further, an original data structure (e.g. an original file) exists, which describes physical characteristics of the dut board 700. For example, the data structure may comprise the information as shown for the file 720. In particular, the original data structure or file may comprise an information about a propagation delay between the first chip tester contact element 702 and the first dut contact element 710, which is designated with $\Delta tp1$. Moreover, the original data structure may comprise information about a propagation delay between the first chip tester contact element 702 and the second dut contact element 711, which is designated with $\Delta tp2$. The original data structure may further comprise information about a propagation delay between the third dut contact element 712 and the second chip tester contact element 704 designated with $\Delta t2$, and an information about a propagation delay between the fourth dut contact element 713 and the third chip tester contact element 706 designated with $\Delta t3$. Alternatively, the information regarding the first dut (namely $\Delta tp1$, $\Delta t2$) and the information regarding the second dut (namely $\Delta tp2$, $\Delta t3$) may be comprised in separate data structures or separate files, as shown at reference numeral 730.

However, in an embodiment of the present invention, a modified data structure comprising modified (or effective) propagation delay values is provided with the dut board. The dut board and the modified data structure may be considered to be a dut board set or test fixture set. In an embodiment of the present invention, the modified data structure (or modified file) comprises an information about the propagation delay between the first chip tester contact element 702 and the first dut contact element 710, for example, the value $\Delta tp1$. Moreover, the modified data structure comprises an information about the propagation delay between the third dut contact elements 712 and the second chip tester contact element 704, for example, the value $\Delta t2$. Additionally, the modified data structure comprises a modified (or effective) information about a propagation delay between the forth dut contact elements 713 and the third chip tester contact element 706. Said amended or effective propagation delay value is, in an embodiment of the present invention, based on the actual propagation delay value $\Delta t3$ and amended on the basis of a propagation delay difference information describing a difference of propagation delays between, on the one hand, the first chip tester contact element 702 and the first dut contact element 710 and, on the other hand, the first chip tester contact element 702 and the second dut contact element 711. For example, the modified propagation delay value may be computed as $$\Delta t3-(\Delta tp2-\Delta tp1).$$

However, an alternative computation method may be used. According to a general embodiment of the present invention, the original propagation delay values between the third dut contact element and the second chip tester contact element ($\Delta t2$), and between the fourth dut contact element and the third chip tester contact element ($\Delta t3$) are modified in such a way that a difference between the amended (or effective) propagation delay values ($\Delta t3$,effective$-\Delta t2$,effective) deviates from a difference between the original propagation values ($\Delta t3-\Delta t2$) by the propagation delay difference for the shared line ($\Delta tp2-\Delta tp1$).

In other words:

$$\Delta t3,\text{effective}-\Delta t2,\text{effective}=\Delta t3-\Delta t2+\Delta tp2-\Delta tp1.$$

For example, the following relations may hold:

$$\Delta t2,\text{effective}=\Delta t2$$

$$\Delta t3,\text{effective}=\Delta t3-(\Delta tp2-\Delta tp1)$$

$$\Delta t3,\text{effective}-\Delta t2,\text{effective}=(\Delta t3-\Delta t2)-(\Delta tp2-\Delta tp1).$$

Alternatively, the following relations may hold:

$$\Delta t2,\text{effective}=\Delta t2$$

$$\Delta t3,\text{effective}=\Delta t3+(\Delta tp2-\Delta tp1)$$

$$\Delta t3,\text{effective}-\Delta t2,\text{effective}=(\Delta t3-\Delta t2)+(\Delta tp2-\Delta tp1).$$

The amended or effective propagation delay values may be comprised in one or more data structures. Exemplary data structures are shown in FIG. 7b, describing an effective dut board 740. In an embodiment of the present invention, an amended data structure (or effective data structure) may, for example, comprise the propagation delay value $\Delta tp1$, the propagation delay value $\Delta t2$,effective and the propagation delay value $\Delta t3$,effective. As described above, the following relations may hold in an embodiment of the present invention:

$$\Delta t2,\text{effective}=\Delta t2;$$

$$\Delta t3,\text{effective}=\Delta t3-(\Delta tp2-\Delta tp1)$$

In an alternative embodiment, two data structures or two separate files may be provided, a first file comprising the propagation delay values $\Delta tp1$ and $\Delta tp2$,effective and the second file comprising the propagation delay values $\Delta tp1$ and $\Delta t3$,effective.

It should be noted here that the amended propagation delay data structures described with reference to FIG. 7b may, for example, be applied if the dut contact element 712, 713 are intended to be connected to input ports of a dut.

In the following, an alternative amended data structure, or effective data structure characterizing a dut board will be described, taking reference to FIG. 7c. For this purpose, FIG. 7c shows a graphical representation of an effective dut board and of a corresponding data structures characterizing the effective dut board.

It should be noted here that the data structures described with reference to FIG. 7c is similar to the data structure described with reference to FIG. 7b. However, the effective propagation delay $\Delta t3$,effective between the third chip tester contact element and the fourth dut contact element is chosen to be $$\Delta t3+(\Delta tp2-\Delta tp1)$$

It should be noted that, according to an embodiment of the present invention, the data structure described with reference to FIG. 7c may, for example, be used if the third dut contact element and the fourth dut contact element are intended to be connected to output ports of two duts.

Figure 7D:
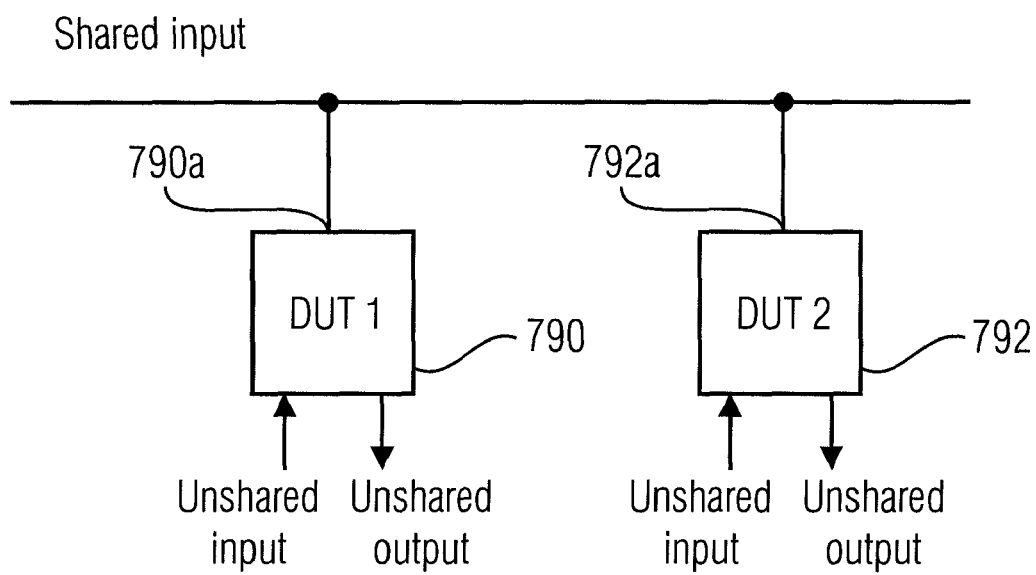
FIG. 7d shows an example of an extended configuration for testing two duts.

FIG. 7d shows an example of an extended configuration for testing two duts. The configuration of FIG. 7d comprises a first dut 790 and a second dut 792. An input 790a of the first dut 790 and an input 792a of the second dut 792 may be configured to be shared inputs. Said inputs 790a, 792a of the first and second dut 790, 792 may therefore be connected to a shared output of the chip tester. Moreover the first dut 790 may comprise at least one unshared input 790b and at least one unshared output 790c. The second dut 792 may also comprise at least on unshared input 792b and at least one unshared output 792c.

In other words, in an embodiment, a device has shared inputs, unshared inputs and unshared outputs.

Figure 8:
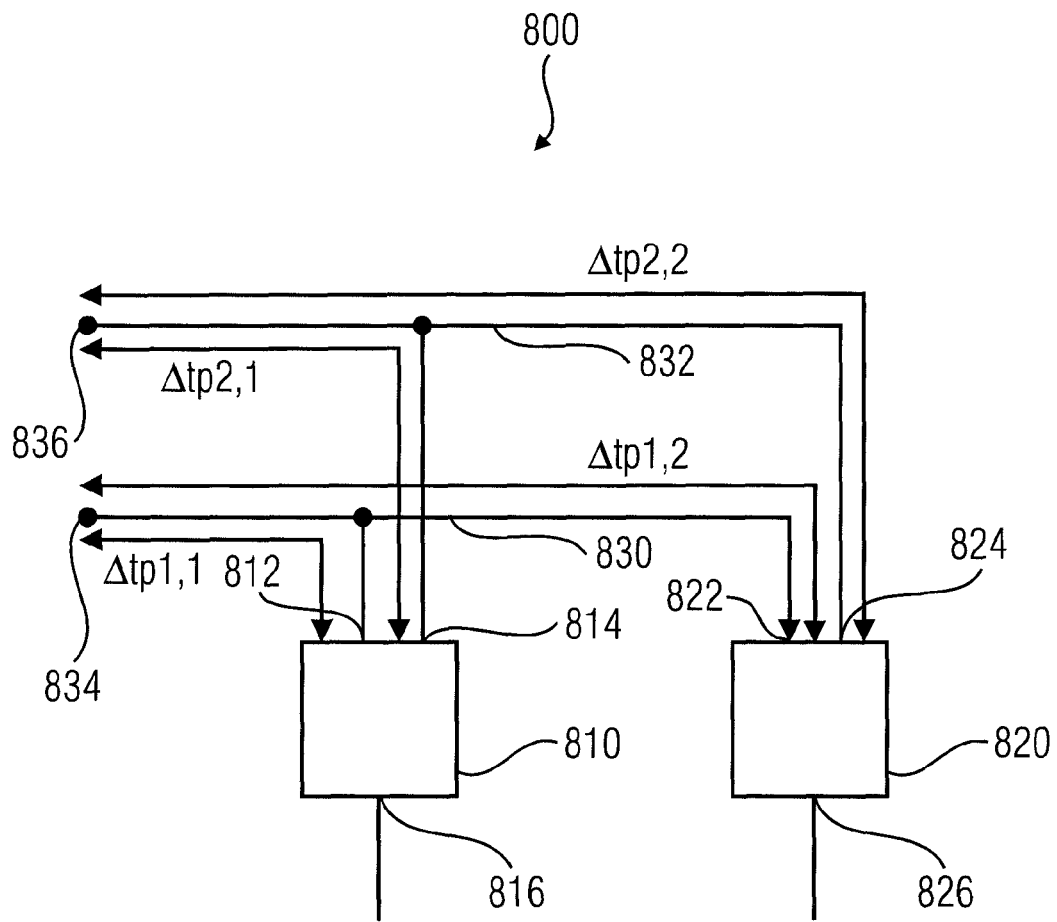
FIG. 8 shows a graphical representation of an averaging scheme for determining an average propagation delay difference value, according to an embodiment of the present invention.

In many test situations, there is more than one shared line. In this case, the timing delay calculator 110 or the propagation delay difference value determinator 720 may be adapted to obtain an information about a difference in propagation delay to different shared inputs of the device under test by performing an averaging. This concept will subsequently be described taking reference to FIG. 8, which shows a block schematic diagram of a test environment comprising at least two duts, each of which comprises at least two shared inputs. The test environment of FIG. 8 is designated in its entirety with 800. A first dut is designated with 810 and a second dut is designated with 820. The first dut 810 comprises a first shared input 812 and a second shared input 814. Moreover, the first dut 812 comprises an additional input or output 816. The second dut 820 comprises a corresponding first shared input 822, a second shared input 824 and another input or output 826. The first shared input 812 of the first dut and the first shared input 822 of the second dut are both connected to a shared, bus-like transmission line 830. The second shared input 814 of the first dut and the second shared input 824 of the second dut are both connected to a second shared, bus-like transmission line 832. The first shared transmission line 830 comprises a chip tester contact element 834, and the second shared transmission line 832 comprises a corresponding chip tester contact element 836. The propagation delay between the chip tester contact element 834 and the first shared input 812 is designated with $\Delta tp1,1$. The propagation delay between the chip tester contact element 834 and the first shared input 822 of the second dut is designated with $\Delta tp1,2$. The propagation delay between the chip tester contact element 836 and the second shared input 814 is designated with $\Delta tp2,1$ and a propagation delay between the second chip tester contact element 836 and the second shared input 824 is designated with $\Delta tp2,2$. Consequently, the propagation delay difference value $\Delta tp1,2-\Delta tp1,1$ for the first shared transmission line can be determined. Similarly, a propagation delay difference value $\Delta tp2,2-\Delta tp2,1$ for the second shared transmission line can be determined. For the further computations, for example, for the calculation of the timing information 114 or for the computation of amended data structures, an average value can be used, which can be obtained by averaging the propagation delay difference values for individual transmission lines.

An averaging formula, which can be supplemented by propagation delay difference values for further shared transmission lines, if desired, is given in FIG. 8.

Figure 9:
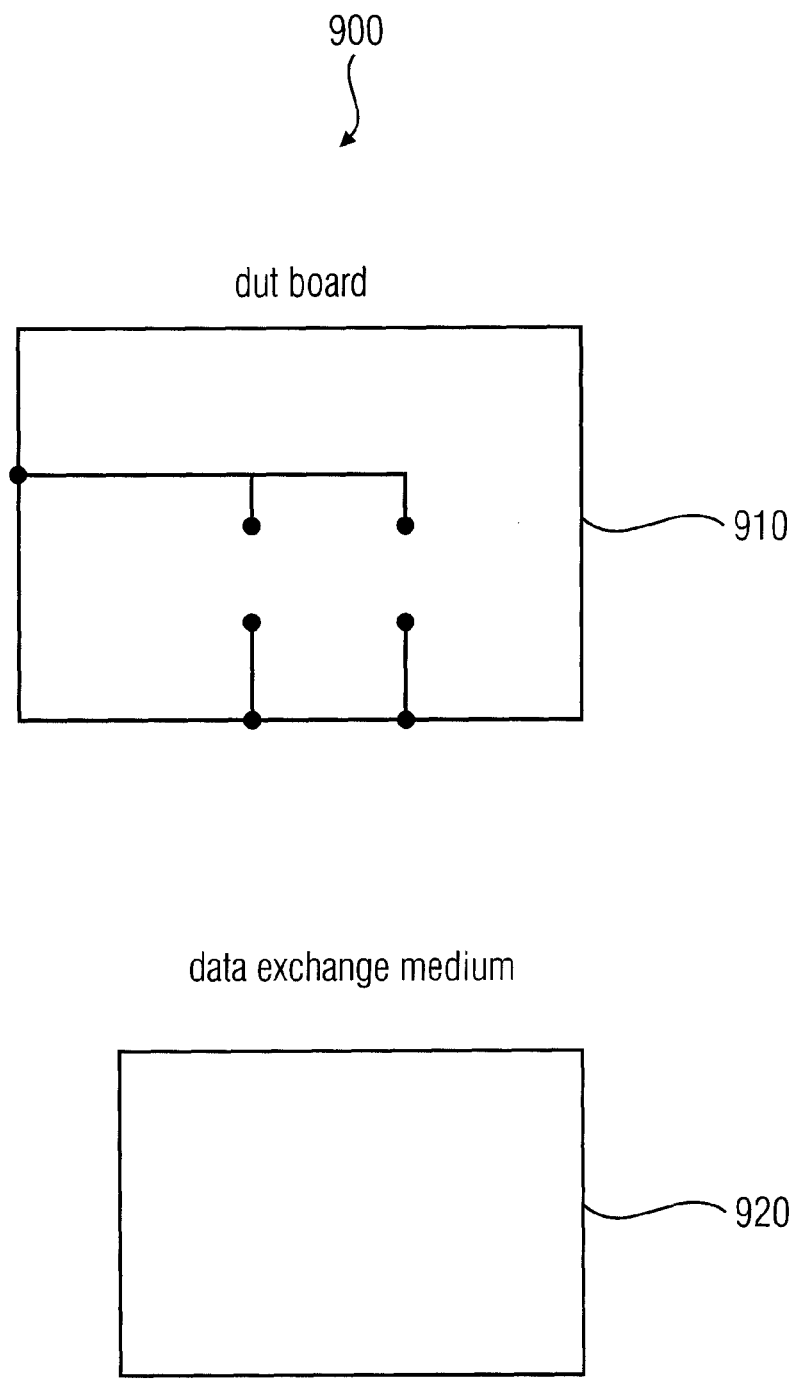
FIG. 9 shows a graphical representation of a dut board set, according to an embodiment of the present invention.

FIG. 9 shows a graphical representation of a test fixture set, according to an embodiment of the present invention. The test fixture set is designated in its entirety with 900. The text fixture set 900 comprises a dut board 910, which may be identical to the dut board 700, described with reference to FIG. 7a. For this reason, reference is taken to the above description.

The test fixture set 900 further comprises a data exchange medium or data carrier 920 comprising the amended (or effective) propagation delay information, as described, for example, with reference to FIGS. 7b and 7c. In other words, the data exchange medium or data carrier 920 may represent one or more of the data structures or files described with reference to FIGS. 7b and 7c. In other words, the data exchange medium or data carrier may comprise an amended or effective propagation delay value for at least one of the transmission lines of the dut board 910. Thus, the data exchange medium or data carrier 920 corresponds to the dut board 910. However, the data exchange medium 920 does not, or does not only, comprise actual or physical information about the propagation delays of the transmission lines of the dut board 910, but also (or exclusively) comprises amended (or effective) propagation delay values, the generation of which was, for example, described with reference to FIGS. 7b and 7c.

The data exchange medium 920 may, for example, be a harddisk, floppy disc, a CD ROM, a DVD, a ROM, a PROM, a EPROM, a EEPROM or a /memory comprising said amended propagation delay values. However, the data exchange medium or data carrier may also be any other volatile or non-volatile data carrier comprising said amended propagation delay values.

Moreover, a data packet adapted to be transported via a data transport network is also considered to be a data carrier or a data exchange medium. Thus, the test fixture set may also take the form of a physical dut board and an online transmission of the corresponding amended propagation delay values.

In the following, a concept will be described, which allows for a compensation of device loading effects. The concept for the compensation of the device loading effects may optionally be applied in combination with the above described concept for adjusting timings of chip tester channels. However, the concept for a compensation of device loading effects described in the following can also be used independent from the above described approach.

Figure 10:
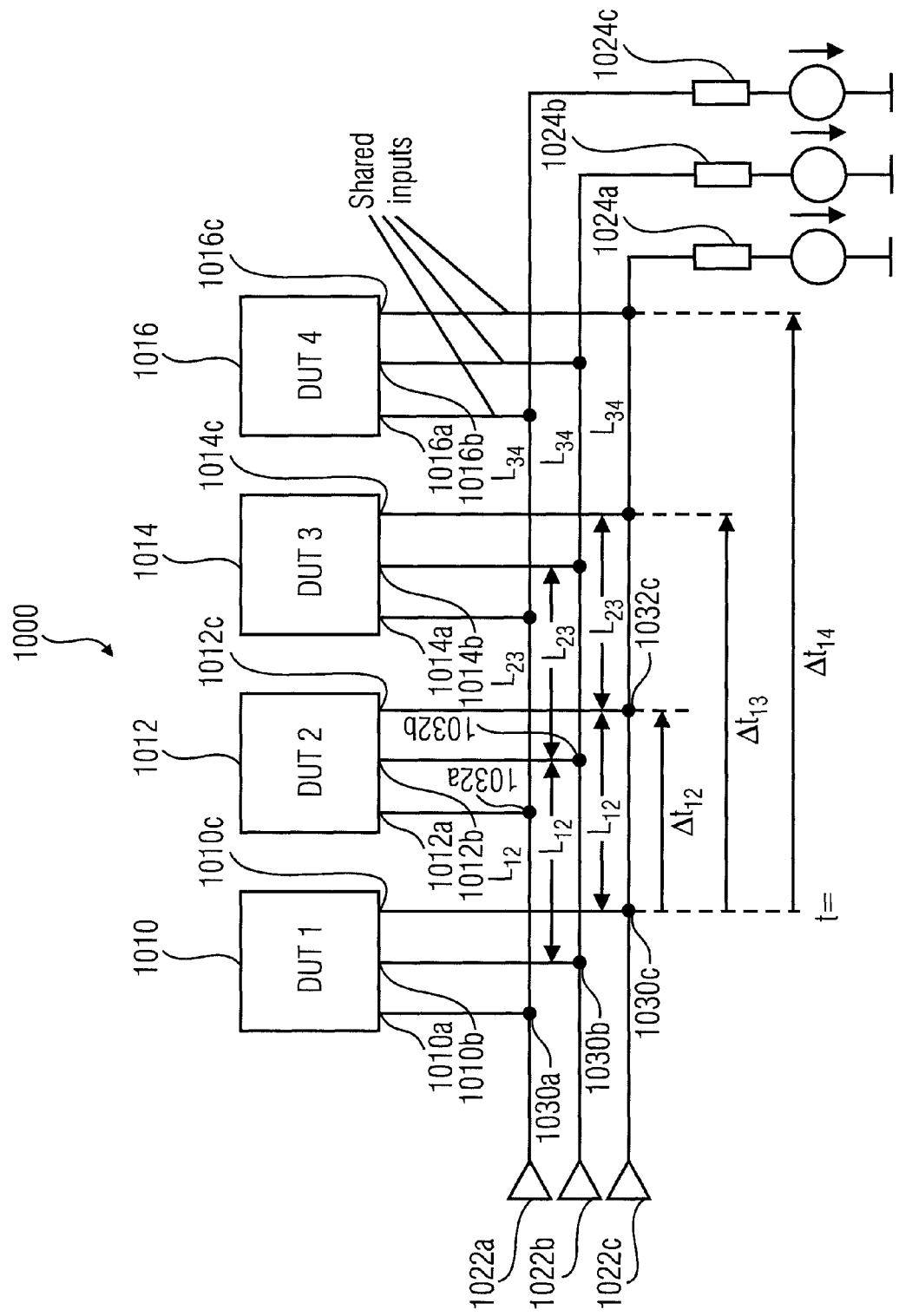
FIG. 10 shows a graphical representation of a dut board comprising more than 2 devices under test, according to an embodiment of the present invention.

For the following considerations, it is assumed that at least two duts are connected to at least one shared line. However, in order to facilitate the understanding, FIG. 10 shows a test setup comprising 4 duts. The sharing factor is N=4. In other words, FIG. 10 shows a block schematic diagram of a test set up comprising 4 duts. Also, FIG. 10 shows propagation delays on a shared bus for a by-4 sharing. The test set up in FIG. 10 is designated in its entirety with 1000. The test set up 1000 comprises 4 duts 1010, 1012, 1014, 1016. Each of the duts comprises, for example, three shared inputs designated with 1010a, 1010b, 1010c, 1012a, 1012b, 1012c, 1014a, 1014b, 1014c, 1016a, 1016b, 1016c. Shared inputs 1010a, 1012a, 1014a, 1016a are all connected to a first shared line 1020a, which is driven by a first channel 1022a of a chip tester. Shared inputs 1010b, 1012b, 1014b, 1016b are all connected to a shared line 1020b, which is driven by a second channel 1022b of the chip tester. Shared inputs 1010c, 1012c, 1014c, 1016c are all connected to a third shared line 1020c, which is driven by a third channel 1022c of the chip tester.

Moreover, it should be noted that in an embodiment of the present invention the shared transmission lines 1020a, 1020b, 1020c are (optionally) terminated by transmission line terminations 1024a, 1024b, 1024c.

Moreover, it should be noted that the shared transmission lines are length-matched in an embodiment of the invention. The shared transmission lines comprise branch points (e.g. branch points 1030a, 1030b, 1030c), at which individual dut transmission lines branch from the shared transmission lines. It should be noted here that the length of the shared transmission lines between corresponding branch points are (at least approximately) identical. For example, a length of a segment of the first transmission line 1020a between the branch point 1030a and the branch point 1032a is, at least approximately, identical to the length of a segment of the second transmission line 1020b between the branch point 1030b and the branch point 1032b. Consequently, a propagation delay between the branch point 1030a and the branch point 1032a is, at least approximately, identical to a propagation delay between the branch point 1030b and the branch point 1032b, and also identical to the propagation delay between the branch points 1030c and 1032c. However, the length $L_{23}$ may be different from the length $L_{12}$. Also, the length $L_{34}$ my be different from the length $L_{23}$. In another embodiment, lengths $L_{12}$, $L_{23}$ and $L_{34}$ may be at least approximately identical.

In the following, the motivation for a compensation of device loading effects will be described, before the technical solution will be presented.

When duts (e.g. memory devices) are tested based on a fixture delay calibration that just compensates the propagation delays of the signal paths including the shared bus as described above, it becomes visible that the timing related results of some measurements, for example, the set up and hold times, still depend on the position of the dut on the shared bus. Further, different measurement results are obtained when some dut sockets on the shared bus are not loaded with devices. The reason for this dependency is that the delay of the signals on the shared bus is not only caused by the limited propagation velocity on the socket board traces (or dut board traces), but also by a parasitic load of duts connected to the shared bus. The loading is dominated by an input capacitance of the shared inputs and causes a distortion of the signals that includes certain delays of the signal transitions. In order to make accurate measurements on a driver sharing interface, the device loading effect may be taken into account. An influence of the device loading on the total signal delay on the shared bus can, for example, be included into the fixture delay calibration. To achieve this, the fixture delay calibration can be performed with a short circuit device inserted in one dut socket and the dut sockets preceeding the shorted circuit loaded with regular devices. Performing a fixture delay calibration with devices loaded up to the short circuit device yields a second set of N fixture delay calibration files with significantly larger values for the shared inputs of DUT 2, . . . DUT N.

To extract an effect of the device loading, the values measured with devices may be subtracted from the values measured without devices.

For DUT 2, the additional load is caused by DUT 1 only, whereas for DUT N, the additional load is caused by DUT 1, . . . DUT (N−1). The loading effect increases from DUT 2 to DUT N for each additional dut.

Assuming that the loading effect per dut is constant, the increase with the dut number is linear. DUT 1 shows the same results with and without devices, because there are no preceding devices (i.e. devices located closer to the chip tester channel than DUT 1) to the dut measured. This allows a simplification of the extraction procedure for the loading effect per dut. It is sufficient that only the fixture delay measurement for DUT N is performed with devices loaded into the circuits of DUT 1 to DUT (N−1). The loading effect per dut is designated with $t_L$ and can be determined from the following formula:

$$t_L = (\Delta t_{1N}[\text{with devices}] - \Delta t_{1N})/(N-1).$$

To calculate $\Delta t_{1N}$ [with devices], the fixture delay values for DUT 1 (e.g. Δtp1) can be taken from the measurement without devices because there is no difference. It is also sufficient to determine a loading effect per dut from only one shared bus (or from one socket board or dut board).

As soon as the loading effect per dut is determined, the values $\Delta t_{1n}$ [with devices] for all n=2, . . . , (N−1) can be calculated from:

$$\Delta t_{1n}[\text{with devices}] = \Delta t_{1n} + (n-1)^* t_L, \text{ for } n=2, \ldots, N-1.$$

Finally, the values $\Delta t_{1n}$ [with devices] are used instead of $\Delta t_{1n}$ during the post-processing that is performed to generate the final fixture delay calibration file, valid for the whole interface.

In an embodiment, the following relations may be fulfilled:

$$\Delta t_{12} = \Delta t_{p2} - \Delta t_{p1} \text{ und}$$

$$\Delta t_{1N} = \Delta t_{pN} - \Delta t_{p1}.$$

In another embodiment, the value $t_L$ for the loading effect can be obtained from a simulation, or from some other calculation.

Figure 11:
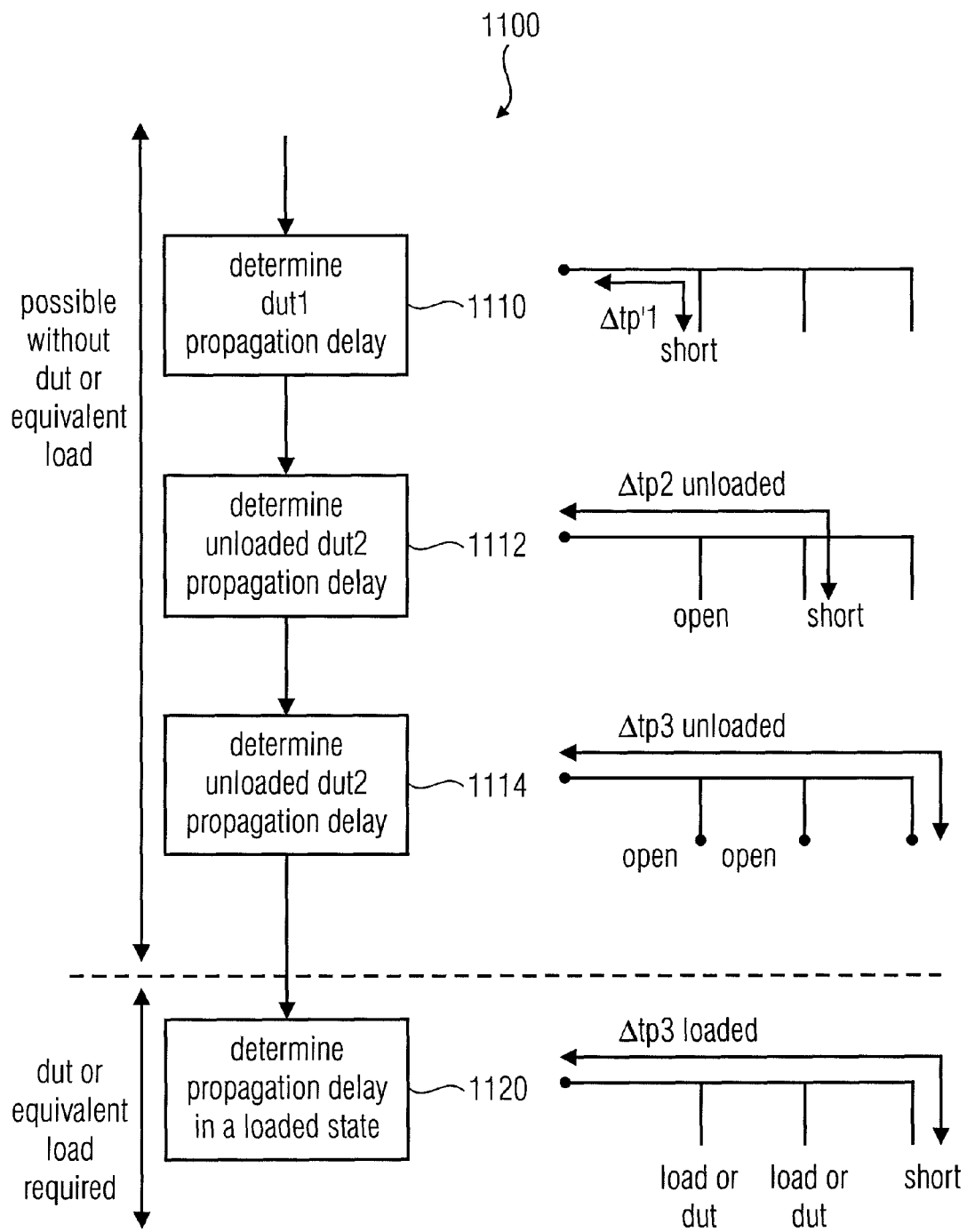
FIG. 11 shows a flow chart of an inventive method for characterizing a dut board.

In the following, the above described algorithm for obtaining device load compensated propagation delay values will be summarized, taking reference to FIG. 11. For this purpose, FIG. 11 shows a flow chart of an inventive method for performing measurements in preparation of a device load compensation. The method of FIG. 11 is designated in its entirety with 1100. A first step 1110 comprises determining a propagation delay Δtp1 for a first dut (i.e. a propagation delay between a chip tester contact element of the dut board a dut contact element of the dut board for the first dut). It should be noted here that the numbering of the duts (1st dut, 2nd dut, . . . ) is chosen such that a lower number of dut indicates that the propagation delay between the chip tester contact element of the dut board and the dut, or between the chip tester channel and the dut, is smaller.

In a second step 1112, an unloaded propagation delay for a second dut (with index n>1) is determined. For this purpose, a dut socket for the first dut is left open, and a short circuit element is placed in the dut socket of the second dut. Consequently, the propagation delay Δtp2 is measured, for example, by performing a time domain reflection measurement.

In a third step 1114, an unloaded propagation delay for the third dut is determined. For this purpose, a dut socket of the first dut and the second dut are left open, and a short circuit element is placed in the dut socket for the third dut. Consequently, the propagation delay Δtp3 is measured, for example, by making a time domain reflection measurement.

Naturally, the measurement can optionally be extended to cover more than three duts.

It should be noted that the order, in which the first step 1110, the second step 1112 and the third step 1114 are executed can be chosen arbitrarily. However, it should also be noted that the first step 1110, the second step 1112 and the third step 1114 can already be performed before a dut is available, and even before it is known which load an actual dut presents to the shared lines. It should also be noted that according to one embodiment of the present invention, the steps 1110, 1112, 1114 are executed by the manufacturer of a dut board.

In a fourth step 1120, a propagation delay value is determined in a loaded state of the dut board. For this purpose, a dut or an equivalent load device, which presents a load to the shared lines that is approximately identical to the load presented by the dut, is placed in at least one dut socket. Moreover, a short circuit device is placed in a higher number dut socket. Thus, there is at least one dut or load device placed in a socket (electrically) between the chip tester connection element of the dut board and the dut socket in which the short circuit device is placed. In an embodiment, all the sockets between the chip tester contact element and the dut socket with the short circuit device are loaded with duts or load devices, but this is not obligatory. Rather, it is sufficient if at least one dut or load device is used.

Consequently, the propagation delay Δt13 in a loaded state can be determined by, for example, making a time domain reflection measurement.

Moreover, it should be noted that a propagation delay contribution per dut (or per load) can, for example, be obtained by comparing results of propagation delay measurements for the same dut position in an unloaded state and in a loaded state of other dut positions, taking into consideration how many duts or loaded devices have been effective in said measurements.

Also, it should be noted that, according to an embodiment of the present invention, only one single propagation delay measurement in a loaded state is needed in order to obtain loaded state propagation delays for different device positions and/or different load states.

For example, if there are N dut positions, the propagation delay measurement in a loaded state only needs to be made for one single load situation to determine a propagation delay contribution per dut. Loaded state propagation delays for other load situations can then be calculated by means of interpolating or extrapolating, assuming that each dut increases linearly a propagation delay.

Moreover, propagation delays for various load states can be calculated. For example, a propagation delay can be calculated for a situation where the first dut and the third dut are placed on a dut board, but wherein a second dut socket is left open. Accordingly, different load states can consequently be handled without taking a measurement for each single load state. In other words, according to an embodiment of the present invention, a propagation delay can be calculated for a load situation, in which at least one dut socket is unloaded, based on the assumption that each loaded dut socket contributes a certain pre-determined propagation delay, and further based on the assumption that an unloaded dut socket does not provide a contribution to the propagation delay.

Moreover, it should be noted that, in an embodiment of the present invention, a reconfiguration of the timing of the chip tester channels may be performed in response to a change of a loading state of the dut sockets. For example, during a test of a plurality of duts in a multi-socket arrangement with shared lines, it may be found that a specific dut socket brings along a particularly high failure rate. In this case, it may, for example, be assumed that the specific socket is defective. Therefore, it may be decided not to place any more duts in the specific dut socket. Accordingly, after the decision not to load the specific dut socket with duts, subsequent testing is performed in a load configuration wherein at least one of the dut sockets is unloaded. In other words, the decision not to load the specific dut socket brings along a change of the dut loading of the shared line. Consequently, it is expected that a timing change occurs, as the loading of the dut socket has an impact on the timing of signals arriving at dut sockets behind the unloaded specific dut socket. Consequently, in an embodiment of the present invention, a timing of the chip tester channels or at least of one chip tester channel, may be recomputed in response to the decision to change a loading state of a specific dut socket. The change of the timing of the chip tester channel is performed such as to compensate for the timing change due to the change of the load state.

The above mechanism can be summarized as follows:

A common strategy of semiconductor manufacturers who perform multi-site testing is the disabling of sites that permanently fail. If a site is disabled, it will no longer be loaded from a device handler and, thus, does no longer show a loading effect. The consequence of this strategy is that the calculation of the $\Delta t_{1,i}$ [with devices] should take care of disabled sites. The handler communicates the disabling of sites to the tester, therefore, this information is available. However, since this information is created dynamically during run time of the test, whereas the fixture delay calibration data are loaded statically at the beginning of a test flow, the test may have to be paused while the fixture delay calibration data are updated. However, it may be expected that the above described strategy will bring along a reduction with respect to test time.

Figure 12:
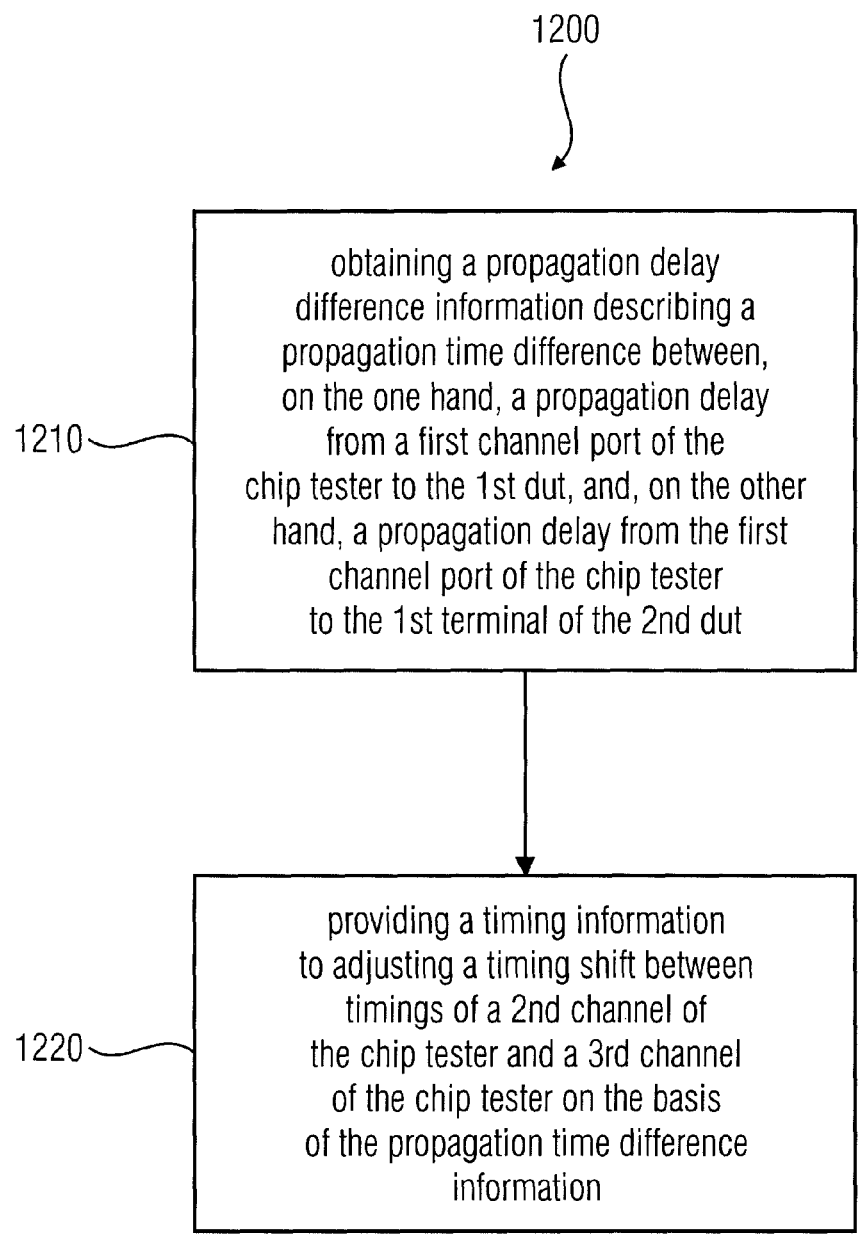
FIG. 12 shows a flow chart of a method for providing timing information for adjusting a timing of a chip tester, according to an embodiment of the present invention.

FIG. 12 shows a flow chart of an inventive method for providing a timing information for adjusting a timing of a chip tester. In an embodiment of the present invention, it is assumed that the chip tester operates in a configuration, in which at least a first terminal of a first dut and a first terminal of a second dut are connected to a first channel of the chip tester via a shared line. Moreover, it is assumed that a second terminal of the first dut is connected to a second channel of the chip tester via an unshared line and that a second terminal of the second dut is connected to a third channel of the chip tester via an unshared line. The method 1200 of FIG. 12 comprises a first step 1210 of obtaining a propagation delay difference information describing a propagation time difference between, on the one hand, a propagation delay from a first channel port of the chip tester to the first terminal of the first dut and, on the other hand, a propagation delay from the first channel port of the chip tester to the first terminal of the second dut. The method 1200 comprises a second step of providing a timing information to adjust a timing shift between timings of a second channel of the chip tester and a third channel of the chip tester on the basis of the propagation time difference information.

It should be noted that the method 1200 of FIG. 12 may be supplemented by any of the functionalities described with respect to the other means and methods herein. Moreover, the present invention comprises a computer program for performing any of the methods described herein.

Depending on certain implementation requirements of the inventive methods, the inventive methods can be implemented in hardware or in software. The implementation can be performed using a digital storage medium, in for example a hard disk, floppy disk, a DVD a CD, a ROM, a PROM, an EPROM, an EEPROM or a FLASH memory having electronically readable control signals stored thereon, which cooperate with a programmable computer system such that the inventive method is performed. Generally, the present invention is, therefore, a computer program product with a program code stored on a machine readable carrier, the program code being operative for performing the inventive method when the computer program product runs on a computer. In other words, the inventive method is, therefore, a computer program having a program code for performing the inventive method when the computer program runs on a computer.

In the following section, a possible implementation of an algorithm for the fixture delay calibration for driver sharing will be described with pseudo-code. It should be noted that the generation of the fixture delay calibration files as described in the procedure fixture_delay_calibration( ) is done, according to an embodiment of the present invention, by the interface manufacturer. The fixture delay calibration files fd[1:N]are, according to an embodiment of the invention, supplied along with the interface.

The algorithm can be described by the following routines, wherein the expression "//" designates a comment, wherein a loop to be repeated for a plurality of values is described by "loop for ... end loop". Moreover, loops are further illustrated by indenting instructions within a loop.

```
Fixture_Delay_Calibration (
N = number of DUTs per shared bus
K = number of shared buses per interface) {
//Analyze pin configuration
Determine P = number of pins per DUT
Loop for n = 1 to N
    Insert K short circuit devices into socket of DUT[n,1:K]
    Create fixture delay calibration file fd[n] for
            DUT [n,1:K]
    Loop for k = 1 to K
        Loop for p = 1 to P
            Measure fixture delay fxdl_val[n,k,p] of pin[p] of
                bus[k] and DUT[n,k]
        End loop p
    End loop k
    Store fixture delay values fxdl_val[n,1:K,1:P] to file
            fd[n]
End loop n
}
Post_Processing_Procedure(
N = number of DUTs per shared bus
K = number of shared buses per interface
fd[1:N] = fixture delay calibration files from
            DUT[1:N,1:K]) {
//Analyze pin configuration
Determine SI = number of shared input per DUT
Determine UI = number of unshared inputs per DUT
Determine OP = number of outputs per DUT
Create new fixture delay calibration file fd_merge for the
        whole interface
//process DUT[1,1:K] data without compensation
Open fixture delay calibration file fd[1] of DUT[1,1:K]
Loop for k = 1 to K
    Loop for si = 1 to SI
        Read fixture delay value of shared input
            si_fxdl_val[1,k,si] from fd[1]
        Write fixture delay value of shared input
            si_fxdl_val[1,k,si] to fd_merge
    End loop si
    Loop for ui = 1 to UI
        Read fixture delay value of shared input
            ui_fxdl_val[1,k,ui] from fd[1]
        Write fixture delay value of shared input
            ui_fxdl_val[1,k,ui] to fd_merge
    End loop ui
    Loop for op = 1 to OP
        Read fixture delay value of output op_fxdl_val[1,k,op]
```

```
            from fd[1]
        Write fixture delay value of output op_fxdl_val[1,k,op]
            to fd_merge
    End loop op
End loop k
//perform compensation for DUT[2:N,1:K] on unshared inputs
        and output pins
Loop for n = 2 to N
    Open fixture delay calibration file fd[n] of DUT[n,1:K]
    Loop for k = 1 to K
        // calculate compensation value
        Loop for si = 1 to SI
            Read fixture delay value of shared input
                si_fxdl_val[n,k,si] from fd[n]
            Si_delta_t[n,k,si] = si_fxdl_val[n,k,si] –
                si_fxdl_val[1,k,si]
        End loop si
        Delta_t1[n,k]= average over si (Si_delta_t[n,k,si])
        // compensate unshared inputs
        Loop for ui = 1 to UI
            Read fixture delay value of unshared input
                ui_fxdl_val[n,k,ui]
            New_ui_fxdl_val[n,k,ui] = ui_fxdl_val[n,k,ui] –
                Delta_t1[n,k]
            Write new fixture delay data of unshared input
                New_ui_fxdl_val[n,k,ui] to fd_merge
        End loop ui
        //compensate outputs
        Loop for op = 1 to OP
            Read fixture delay value of output
                op_fxdl_val[n,k,op]
            New_ui_fxdl_val[n,k,op] = ui_fxdl_val[n,k,op] +
                Delta_t1[n,k]
            Write new fixture delay value of output
                New_ui_fxdl_val[n,k,op] to fd_merge
        End loop op
    End loop k
End loop N
}
Fixture_Delay_Calibration_for_Driver_Sharing(
N = number of DUTs per shared bus
K = number of shared buses per interface
fd[1:N] = fixture delay calibration files from
            DUT[1:N,1:K]) {
Fixture_Delay_Calibration(N,K)
Post_Procesing_Procedure(N,K,fd[1:N])
}
```

Moreover, in the following an algorithm for a compensation of device loading effects will be described. The algorithm described in the following takes into account the device loading and is described with pseudo-code. The following table shows a correspondence of symbols in the text to variables used in the pseudo-code:

| Symbol used in text | Variable used in pseudo code |
|---|---|
| DUTn on shared bus k | DUT[n,k] |
| $\Delta t_{1n}$ | Delta_t1[n,k] |
| $t_L$ | Loading_effect |
| $\Delta t_{1N}$[with devices] | Delta_t1_L[N,1] |
| $\Delta t_{1n}$[with devices] | Delta_t1[n,k] |

The following listings describe some program routines, according to some embodiments of the present invention.

```
Correction_Procedure_for_Loading_Effect (
N = number of DUTs per shared bus) {
//it is sufficient to only measure the bus k = 1 and
    DUT[n=N,k=1]
//Analyze pin configuration
```

```
Determine P = number of pins per DUT
Insert short circuit device into socket of DUT[N,1] bus[1]
Insert N-1 regular devices into socket of DUT[1:N-1,1]
        bus [1]
Create fixture delay calibration file fd_L for DUT[N,1]
        bus [1]
Loop for p = 1 to P
    Measure fixture delay fxdl_val[p,1,N] of pin[p] of bus[1]
        and DUT[N,1]
End loop p
Write fixture delay values fxdl_val[1:P,1,N] to file fd_L
}
Post_Processing_Procedure_Including_Loading_Effect(
N = number of DUTs per shared bus
K = number of shared buses per interface
fd[1:N] = fixture delay calibration files from DUT[1:N,1:K]
fd_L = fixture delay calibration file for DUT[N,1] bus[1]
        with loading) {
//Analyze pin configuration
Determine SI = number of shared input per DUT
Determine UI = number of unshared inputs per DUT
Determine OP = number of outputs per DUT
//extract device loading effect
Open fixture delay calibration file fd_L of DUT[N,1]
Open fixture delay calibration file fd[N] of DUT[N,1:K]
Loop for si = 1 to SI
    Read fixture delay value of shared input
        si_fxdl_val_L[N,1,si] from fd_L
    Read fixture delay value of shared input
        si_fxdl_val[N,1,si] from fd[N]
    Si_delta_t_L[N,1,si] = si_fxdl_val_L[N,1,si] -
        si_fxdl_val[N,1,si]
End Loop si
Delta_t1_L[N,1] = average over si (Si_delta_t_L[N,1,si])
Loading_effect = (Delta_t1_L[N, 1])/(N-1)
Create new fixture delay calibration file fd_merge for the
        whole interface
//process DUT[1,1:K] data without compensation
Open fixture delay calibration file f[1] of DUT[1,1:k]
Loop for k = 1 to K
    Loop for si = 1 to SI
        Read fixture delay value of shared input
            si_fxdl_val[1,k,si] from fd[1]
        Write fixture delay value of shared input
            si_fxdl_val[1,k,si] to fd_merge
    End loop si
    Loop for ui = 1 to UI
        Read fixture delay value of shared input
            ui_fxdl_val[1,k,ui] from fd[1]
        Write fixture delay value of shared input
            ui_fxdl_val[1,k,ui] to fd_merge
    End loop ui
    Loop for op = 1 to OP
        Read fixture delay value of output op_fxdl_val[1,k,op]
            from fd[1]
        Write fixture delay value of output op_fxdl_val[1,k,op]
            to fd_merge
    End loop op
End loop k
//perform compensation for DUT[2:N,1:K] on unshared inputs
        and output pins
Loop for n = 2 to N
    Open fixture delay calibration file fd[n] of DUT[n,1:K]
    Loop for k = 1 to K
        // calculate compensation value
        Loop for si = 1 to SI
            Read fixture delay value of shared input
                si_fxdl_val[n,k,si] from fd[n]
            Si_delta_t[n,k,si] = si_fxdl_val[n,k,si] -
                si_fxdl_val[1,k,si]
        End loop si
        Delta_t1[n,k]= average over si (Si_delta_t[n,k,si]) +
            Loading_effect * (n-1)
        // compensate unshared inputs
        Loop for ui = 1 to UI
            Read fixture delay value of unshared input
                ui_fxdl_val[n,k,ui]
            New_ui_fxdl_val[n,k,ui] = ui_fxdl_val[n,k,ui] -
                Delta_t1[n,k]
            Write new fixture delay data of unshared input
                New_ui_fxdl_val[n,k,ui] to fd_merge
        End loop ui
        //compensate outputs
        Loop for op = 1 to OP
            Read fixture delay value of output
                op_fxdl_val[n,k,op]
            New_ui_fxdl_val[n,k,op] = ui_fxdl_val[n,k,op] +
                Delta_t1[n,k]
            Write new fixture delay value of output
                New_ui_fxdl_val[n,k,op] to fd_merge
        End loop op
    End loop k
End loop N
}
Fixture_Delay_Calibration_for_Driver_Sharing_Including_Load
    ing_Effect(
N = number of DUTs per shared bus
K = number of shared buses per interface) {
Fixture_Delay_Calibration(N,K)
Correction_Procedure _for_Loading_Effect(N)
Post_Procesing_Procedure(N,K,fd[1:N],fd_L)
}
```

To summarize the above description, it can be stated that the description provides an overview of a solution proposal for a fixture delay calibration when using driving sharing interfaces. The problem underlying the present invention can be summarized as follows: Due to a sharing of single tester driver channels for multiple device inputs, multiple different propagation delays in the interface may need to be compensated for each shared driver. The compensation should take into account a signal path from a pogo interface to individual duts connected to a shared bus. Since fixture delay calibration delay can only compensate a single path to one dut board, the above described new solution has been developed to also compensate a signal path to other duts connected to one shared bus. Embodiments of the above described invention allow for an efficient calibration and also bring along the possibility to operate test setups with driver sharing at very high speed without compromising reliability of the test results.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A chip tester for testing at least two devices under test connected to the chip tester, wherein at least a first terminal of the a first device under test and a first terminal of a second device under test are connected to a first channel of the chip tester via a shared line, wherein a second terminal of the first device under test is connected to a second channel of the chip tester via an unshared line, and wherein a second terminal of the second device under test is connected to a third channel of the chip tester via an unshared line, the chip tester comprising:
  a timing calculator for generating a timing information for the channels of the chip tester,
  wherein the timing calculator is adapted to acquire a propagation delay difference information describing a difference between, on the one hand, a propagation delay from a first channel port of the chip tester to the first terminal of the first device under test and, on the other hand, a propagation delay from the first channel port of the chip tester to the first terminal of the second device under test, and wherein the timing calculator is adapted to provide timing information to adjust a timing shift between timings of the second channel and the third channel on the basis of the propagation time difference information; and a channel module configurator adapted to configure the second channel and/or the third channel of the chip tester on the basis of the timing information.

2. The chip tester of claim 1, wherein the timing calculator is adapted to provide a timing information both for the second channel.

3. The chip tester of claim 1, wherein the second channel and the third channel are adapted to provide, shifted in time with respect to each other, identical data patterns to the second terminal of the first device under test and to the second terminal of the second device under test.

4. The chip tester of claim 1, wherein:
the second channel of the chip tester is configured to be an output channel,
the third channel of the chip tester is configured to be an output channel, and
the timing calculator and the channel module configurator are adapted to adjust output timings of the second channel and the third channel such that a relative timing of signals reaching the first terminal and the second terminal of the first device under test is at least approximately identical to a relative timing of signals reaching the first terminal and the second terminal of the second device under test.

5. The chip tester of claim 4, wherein the timing calculator and the channel module configurator are adapted to effect a delay of an output timing of the third channel with respect to an output timing of the second channel, if the propagation delay from the first channel port of the chip tester to the first terminal of the first device under test is larger than the propagation delay from the first channel port of the chip tester to the first terminal of the second device under test.

6. The chip tester of claim 1, wherein:
the second channel of the chip tester is configured to be an input channel,
the third channel of the chip tester is configured to be an input channel, and
the timing calculator and the channel module configurator are adapted to adjust input timings of the second channel and the third channel such that a relative timing between a signal reaching the first terminal of the first device under test and an effective dut signal value sample time of the second channel is at least approximately identical to a relative timing between a signal reaching the first terminal of the second device under test and an effective dut signal value sample time of the third channel,
wherein the effective dut signal value sample time defines, when a signal sampled in a channel has been present at a dut terminal.

7. The chip tester of claim 6, wherein the timing calculator and the channel module configurator are adapted to adjust input clocks of the second channel and the third channel, in order to set the effective dut signal value sample times, wherein the input clock of the second channel defines an instance in time when the signal provided by the second terminal of the first device under test is sampled or compared with a reference value, and wherein the input clock of the third channel defines an instance in time when the signal provided by the second terminal of the second device under test is sampled or compared with a reference value.

8. The chip tester of claim 6, wherein the second channel of the chip tester and the third channel of the chip tester are configured to compare, shifted in time with respect to each other, a data pattern provided by the second terminal of the first device under test and a data pattern provided by the second terminal of the second device under test with identical reference data patterns.

9. The chip tester of claim 6, wherein the timing calculator and the channel configurator are adapted to delay a timing of the third channel) with respect to a timing of the second channel, if the propagation delay from the first channel port of the chip tester to the first terminal of the first device under test is larger than the propagation delay from the first channel port of the chip tester to the first terminal of the second device under test.

10. The chip tester of claim 1, wherein the chip tester is adapted to adjust timings of different channels individually.

11. The chip tester of claim 1, wherein the chip tester is adapted to acquire the propagation delay difference information by performing at least one time-domain-reflection measurement.

12. The chip tester of claim 1, wherein the chip tester is adapted to acquire the propagation delay difference information by reading the propagation delay difference information from a file.

13. The chip tester of claim 1, wherein the timing calculator is adapted to acquire an averaged propagation delay difference information by averaging propagation delay difference information for a plurality of shared channels, each of the shared channels being connectable both to a terminal of the first device under test and to a terminal of the second device under test.

14. The chip tester of claim 1, wherein the chip tester is adapted to adjust a timing of at least one channel coupled to a given device under test in dependence on whether a device under test is loaded in another device under test socket or not.

15. The chip tester of claim 14, wherein the chip tester is adapted to acquire a loading state dependent propagation delay information describing a propagation delay between a channel port and terminal connections of a given device under test in different loading states of a line connecting the channel port and the given device under test, and to apply the loading state dependent propagation delay information to adjust the timing of the at least one channel coupled to the given device under test.

16. The chip tester of claim 15, wherein the chip tester is adapted to acquire an unloaded-state propagation delay information describing a propagation delay between the channel port and terminal connections for at least a first device under test, a second device under test and a third device under test connectable to the channel port via a shared line;
to acquire a loaded-state propagation delay between the channel port and a terminal connection under consideration with at least one device under test load being arranged electrically between the channel port and the terminal connection under consideration; and
to provide an estimate for a loaded-state propagation delay between the channel port and at least one further terminal connection by means of a calculation based on the assumption that each device under test load electrically between the channel port and the device under test connection, for which the calculation is performed, contributes an identical propagation delay.

17. The chip tester of claim 14, wherein the chip tester is adapted to adjust a timing of at least one channel during the execution of a test run in response to a signal indicating that a device under test socket will no longer be loaded by a device under test socket loading mechanism.

18. A test fixture set, comprising:
a device under test board for providing an electrical connection between a chip tester and at least two devices under test, the device under test board comprising
a first device under test contact element for providing a detachable electrical contact between the device under test board and a first device under test,
a second device under test contact element for providing a detachable electrical contact between the device under test board and a second device under test,
a third device under test contact element for providing a detachable electrical contact between the device under test board and the first device under test,
a fourth device under test contact element for providing a detachable electrical contact between the device under test board and the second device under test,
a first chip tester contact element for providing a detachable electrical contact between the device under test board and the chip tester,
a second chip tester contact element for providing a detachable electrical contact between the device under test board and the chip tester, and
a third chip tester contact element for providing a detachable electrical contact between the device under test board and the chip tester,
wherein the first device under test contact element and the second device under test contact element are both electrically connected to the first chip tester contact element via a shared line;
wherein the third device under test contact element is electrically connected to the second chip tester contact element;
wherein the fourth device under test contact element is electrically connected to the third chip tester contact element; and
a data exchange medium or data stream for usage with the chip tester, the data exchange medium or data stream comprising an effective propagation delay information describing an effective propagation delay between the third device under test contact element and the second chip tester contact element and an effective propagation delay between the fourth device under test contact element and the third chip tester contact element,
wherein the effective propagation delays are based on actual propagation delays and wherein at least one of the effective propagation delays is changed with respect to a corresponding actual propagation delay, such that the deviation of the effective propagation delay from the actual propagation delay reflects a difference between, on the one hand, a propagation delay between the first chip tester contact element and the first device under test contact element and, on the other hand, a propagation delay between the first chip tester contact element and the second device under test contact element.

19. The test fixture set of claim 18, further comprising:
a fifth device under test contact element for providing an electrical contact between the device under test board and the first device under test, a sixth device under test contact element for providing an electrical contact between the device under test board and the second device under test and a fourth chip tester contact element for providing a detachable electric contact between the device under test board and the chip tester;
wherein the fifth device under test contact element and the sixth device under test contact element are both electrically coupled to a fourth chip tester contact element via a second shared line,
wherein a portion of the first shared line between the first device under test contact element and the second device under test contact element is length-matched to a portion of the second shared line between the fifth device under test contact element and the sixth device under test contact element.

20. An apparatus for post-processing a plurality of propagation delay values of a device under test board for a chip tester, wherein the device under test board is adapted to provide an electrical connection between a chip tester and at least two devices under test, and wherein the device under test board comprises a first device under test contact element for providing a detachable electrical contact between the device under test board and a first device under test, a second device under test contact element for providing a detachable electrical contact between the device under test board and a second device under test, a third device under test contact element for providing a detachable electrical contact between the device under test board and the first device under test, a fourth device under test contact element for providing a detachable electrical contact between the device under test board and the second device under test, a first chip tester contact element for providing a detachable contact between the device under test board and the chip tester, a second chip tester contact element for providing a detachable contact between the device under test board and the chip tester, a third chip tester contact element for providing a detachable electrical contact between the device under test board and a chip tester, wherein the first device under test contact element and the second device under test contact element are both electrically connected to the first chip tester contact element via a shared line, the apparatus comprising:
a propagation delay determinator for acquiring an original propagation delay value describing a propagation delay between the fourth device under test contact element and the third chip tester contact element;
a propagation delay difference value determinator for acquiring a propagation delay difference value describing a difference between, on the one hand, a propagation delay between the first chip tester contact element and the first device under test contact element and, on the other hand, a propagation delay between the first chip tester contact element and the second device under test contact element; and
a propagation delay modifier for modifying the original propagation delay value on the basis of the propagation delay difference value.

21. The apparatus of claim 20, wherein the apparatus is adapted to leave original propagation delay values describing a propagation delay between the first chip tester contact element of the device under test board and the corresponding first device under test contact element for a first device under test, which is located electrically closest to the first chip tester contact element, unchanged.

22. The apparatus of claim 20, wherein the apparatus for post-processing is adapted to provide an effective propagation delay value describing an effective propagation delay between the fourth device under test contact element and the third chip tester contact element by subtracting the difference between, on the one hand, a propagation delay between the first chip tester contact element and the first device under test contact element and, on the other hand, the propagation delay between the first chip tester contact element and the second device under test contact element, from the original propagation delay value describing, at least approximately, the actual propagation delay between the fourth contact element and the third chip tester contact element.

23. The apparatus of claim 22, wherein the apparatus for post-processing is adapted to receive a terminal direction information describing whether the second terminal of the second device under test is used in an input terminal or as an output terminal, and to decide, whether to acquire the effective propagation delay by adding or by subtracting, in dependence on the terminal direction information.

24. The apparatus of claim 20, wherein the apparatus for post-processing is adapted to avoid providing a negative effective propagation delay value by applying an additional offset value to the effective propagation delay values.

25. The apparatus of claim 20, wherein the apparatus for post-processing is adapted to provide an effective propagation delay value describing an effective propagation delay between the fourth device under test contact element and the third chip tester contact element by adding the difference between, on the one hand, a propagation delay between the first chip tester contact element and the first device under test contact element and, on the other hand, the propagation delay between the first chip tester contact element and the second device under test contact element, to the original propagation delay value describing, at least approximately, the actual propagation delay between the fourth contact element and the third chip tester contact element.

26. The apparatus of claim 20, wherein the apparatus for post-processing is adapted to merge a plurality of files describing propagation delay values for a plurality of device under test positions into a single file.

27. A method for post-processing a plurality of propagation delay values for a device under test board for a chip tester, wherein the device under test board is adapted to provide an electrical connection between the chip tester and at least two devices under test, and wherein the device under test board comprises a first device under test contact element for providing a detachable electrical contact between the device under test board and a first device under test, a second device under test contact element for providing a detachable electrical contact between the device under test board and a second device under test, a third device under test contact element for providing a detachable electrical contact between the device under test board and the first device under test, a fourth device under test contact element for providing a detachable electrical contact between the device under test board and the second device under test, a first chip tester contact element for providing a detachable electrical contact between the device under test board and the chip tester, a second chip tester contact element for providing a detachable electrical contact between the device under test board and the chip tester, and a third chip tester contact element for providing a detachable electrical contact between the device under test board and a chip tester, wherein the first device under test contact element and the second device under test contact element are both electrically connected to the first chip tester contact element via a shared line, the method comprising:

acquiring an original propagation delay value describing a propagation delay between the fourth device under test contact element and the third chip tester contact element;

acquiring a propagation delay difference value describing a difference between, on the one hand, a propagation delay between the first chip tester contact element and the first device under test contact element, and, on the other hand, a propagation delay between the first chip tester contact element and the second chip tester contact element; and modifying the original propagation delay value using the propagation delay difference value.

28. A method for providing timing information for adjusting a timing of a chip tester operating in a configuration in which at least a first terminal of a first device under test and a first terminal of a second device under test are connected to a first channel of the chip tester via a shared line and in which a second terminal of the first device under test is connected to a second channel of the chip tester via an unshared line and in which a second terminal of the second device under test is connected to a third channel of the chip tester via an unshared line, the method comprising:

acquiring a propagation delay difference information describing a propagation time difference between, on the one hand, the propagation delay from a first channel port of the chip tester to the first terminal of the first device under test, and, on the other hand, a propagation delay from the first channel port of the chip tester to the first terminal of the second device under test; and providing the timing information to adjust a timing shift between timings of the second channel and the third channel on the basis of the propagation time difference information.

* * * * *